United States Patent
Yamaguchi et al.

(10) Patent No.: US 7,115,475 B2
(45) Date of Patent: Oct. 3, 2006

(54) METHOD OF MANUFACTURING SEMICONDUCTOR DEVICE

(75) Inventors: Masakazu Yamaguchi, Kanagawa (JP); Wataru Saito, Kanagawa (JP); Ichiro Omura, Kanagawa (JP); Masaru Izumisawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 161 days.

(21) Appl. No.: 11/002,638

(22) Filed: Dec. 3, 2004

(65) Prior Publication Data
US 2005/0098826 A1    May 12, 2005

Related U.S. Application Data

(62) Division of application No. 10/388,498, filed on Mar. 17, 2003, now Pat. No. 6,844,592.

(30) Foreign Application Priority Data
Mar. 18, 2002 (JP) .............................. 2002-074633

(51) Int. Cl.
*H01L 21/336* (2006.01)
(52) U.S. Cl. ..................................................... 438/268
(58) Field of Classification Search ................ 438/268, 438/286, 269, 270
See application file for complete search history.

(56) References Cited

U.S. PATENT DOCUMENTS 6,475,864 B1 * 11/2002 Sato et al. ................... 438/268
2005/0098826 A1    5/2005 Yamaguchi et al.

OTHER PUBLICATIONS

U.S. Appl. No. 11/358,411, filed Feb. 22, 2006, Saito, et al.
U.S. Appl. No. 11/363,047, filed Feb. 28, 2006, Saito, et al.

* cited by examiner

*Primary Examiner*—Howard Weiss
*Assistant Examiner*—(Vikki) Hoa B. Trinh
(74) *Attorney, Agent, or Firm*—Oblon, Spivak, McClelland, Maier & Neustadt, P.C.

(57) ABSTRACT

A method of manufacturing a semiconductor device in which a trench groove is formed in a first conductivity type semiconductor layer, and a second conductivity type semiconductor layer is epitaxially grown so as to bury the trench groove. The second conductivity type semiconductor layer is then removed until a surface of the first conductivity type semiconductor layer is exposed. The first conductivity type semiconductor layer is epitaxially grown on the first conductivity type semiconductor layer and the second conductivity type semiconductor layer such that the thickness of the first conductivity type semiconductor layer increases by a length which is substantially the same as a depth of the trench groove. The first conductivity type semiconductor layer is selectively removed such that the second conductivity type semiconductor layer is exposed, and the epitaxially growing of the second conductivity type semiconductor layer is repeated through selectively removing the first conductivity type semiconductor layer.

1 Claim, 28 Drawing Sheets

METHOD OF MANUFACTURING SEMICONDUCTOR DEVICE

CROSS REFERENCE TO RELATED APPLICATION

This application is a division of application Ser. No. 10/388,498, filed on Mar. 17, 2003 now U.S. Pat. No. 6,844,592, the contents of which are incorporated herein by reference. This application also claims benefit of priority under 35 USC § 119 to Japanese patent application No. 2002-74633, filed on Mar. 18, 2002, the contents of which are incorporated by reference herein.

BACKGROUND OF THE INVENTION

1. Field of the Invention

The present invention relates to a semiconductor device and a method of manufacturing a semiconductor device, and in particular, to a structure of a junction terminating region portion of a power semiconductor device which is suitable for a switching element for electric power.

2. Related Background Art

In response to the demand to make electrical power equipment compact and high-performance in recent years in the power electronics field, performance improvements with respect to making lowering loss, increasing speed and improving the ruggedness have been carried out in addition to making them have a high breakdown voltage and making them able to handle great current in the power semiconductor devices. Among them, a power MOSFET (Metal Oxide Semiconductor Field Effect Transistor) has been established as a key device in the switching power source field or the like because of the high-speed switching performance thereof.

Because the MOSFET is a majority carrier device, the MOSFET has an advantage that there is no minority carrier storage time and switching is fast. However, on the other hand, because there is no electric conductivity modulation, a device which has a high breakdown voltage is disadvantageous with respect to the ON-state resistance as compared with a bipolar device such as an IGBT (Insulated Gate Bipolar Transistor) or the like. This results from the fact that the higher the breakdown voltage a device has, the more the ON-state resistance of the MOSTFET increases, because it is necessary to make an n type base layer thicker and to make the impurity concentration lower in order to obtain a higher breakdown voltage in the MOSFET.

The ON-state resistance of the power MOSFET greatly depends on the electrical resistance in a conductive layer (n type drift layer) portion. Further, the impurity concentration determining the electrical resistance at the n type drift layer cannot rise to greater than or equal to the limit, in accordance with the breakdown voltage of the pn junction which the p type base and the n type drift layer form. Therefore, a trade-off relationship exists between the device breakdown voltage and the ON-state resistance. It is important to improve this trade-off for a low electric power consumption device. In this trade-off, there is a limit which is determined by the material of the device, and this limit must be exceeded in order to realize a low ON-state resistance device exceeding existing power devices.

As one example of MOSFETs for solving this problem, a structure is known in which a resurf structure called a super junction structure is buried in an n type drift layer. A conventional power MOSFET having a super junction structure will be described with reference to FIG. 36. Note that, in the following figures, like parts are denoted by like reference numerals, and detailed descriptions thereof will be omitted.

FIG. 36 is a cross-sectional view showing a schematic structure of one example of a conventional power MOSFET. In the MOSFET shown in the view, an n+ type drain layer 100 is formed on one surface of an n– type drift layer 102, and a drain electrode 40 is formed on the n+ type drain layer 100. Further, a plurality of p type base layers 108 are selectively formed in the other surface portion of the n– type drift layer 102, and n+ type source layers 110 are selectively formed in the surfaces of the respective p type base layers 108. Further, a gate electrode 114 is formed on the surface region of the n– type drift layer 102 which are sandwiched by the adjacent p type base layers 108, the surfaces of the p type base layers 108 sandwiching the n– type drift layer 102, and the surface region of the portions of the n+ type source layer 110 facing each other via the p type base layers 108 and the n– type drift layer 102, with a gate insulating film 112 interposed therebetween. Further, source electrodes 116 are respectively formed on the region of the surfaces of the n+ type source layer 110 and the surface of the p type base layer 108 so as to sandwich the gate electrode 114. Moreover, in the n– type drift layer 102 between the p type base layer 108 and the n+ type drain layer 100, a p type drift layer 106, which is formed so as to form a resurf layer and is connected to the p type base layer 108, is formed. In this way, the power MOSFET shown in FIG. 36 has a vertical type resurf structure in which the p type drift layers 106 and the portions of the n– type drift layers 102 sandwiched by these p type drift layers 106 are alternately repeated in the lateral direction.

In an OFF-state, a depletion layer spreads at junctions between these p type drift layers 106 and n– type drift layers 102. Even if the impurity concentration of the n– type drift layers 102 is made high, the n– type drift layers 102 and the p type drift layers 106 are completely depleted before breaking down. In accordance therewith, a breakdown voltage which is the same as that of the conventional MOSFET can be obtained.

The impurity concentration of the n– type drift layer 102 does not depend on a breakdown voltage of the device, but it depends on the width of the p type drift layer 106 and the width of the n– type drift layer 102 itself between these p type drift layers 106. If the width of the n– type drift layer 102 and the width of the p type drift layer 106 are made narrower, the impurity concentration of the n– type drift layer 102 can be made much higher, and a greater reduction of the ON-state resistance and a higher breakdown voltage can be achieved.

At the time of designing such a MOSFET, the impurity concentrations of the n– type drift layer 102 and the p type drift layer 106 are important to determine the breakdown voltage and the ON-state resistance. In principle, due to the respective impurity concentrations of the n– type drift layer 102 and the p type resurf layer 106 being made equal, the impurity concentrations equivalently become zero, the high breakdown voltage can be obtained.

However, with respect to the semiconductor device having a conventional super junction structure, no structure has been developed which is effective for obtaining a high breakdown voltage in a blocking state (OFF-state) or at the time of turning-off at a junction terminating region portion which is positioned at the outer periphery of an element active region portion (hereinafter referred to as a cell region portion) and which is a region portion for maintaining the breakdown voltage by attenuating the electrical field by extending the depletion layers. Therefore, because the way of spreading of the depletion layers in the cell region portion and the junction terminating region portion are different from one another, the optimum impurity concentrations are different from one another. Accordingly, if the device is manufactured such that the impurity amounts in the cell region portion and the junction terminating region portion are the same, the breakdown voltage at the terminating portion decreases, and an electric field locally concentrates at this place. As a result, there are cases in which the device is broken. In this way, there is the problem that a sufficiently high breakdown voltage cannot be obtained by the entire device in the prior art.

Further, because there are dispersions among the processes at the time of actual manufacturing, it is difficult to make the respective impurity amounts of the n− type drift layer 102 and the p type drift layer 106 completely equal, and the breakdown voltage deteriorates in accordance therewith. Accordingly, it is necessary to carry out designing of the device in consideration of such a decrease of the breakdown voltage due to the process margin. In order to lower the ON-state resistance, it is effective to raise the impurity concentration of the n− type drift layer 102. On the other hand, the process margin for the breakdown voltage is determined by the difference in the impurity amounts between the n− type drift layer 102 and the p type drift layer 106. Therefore, when the impurity amount of the n− type drift layer 102 is increased, because the difference itself determining the process margin is not changed, the ratio between the allowed impurity amount and the impurity amount of the n− type drift layer 102 becomes small. Namely, the process margin becomes small.

BRIEF SUMMARY OF THE INVENTION

According to a first aspect of the present invention, there is provided a semiconductor device comprising:

a first—first conductivity type semiconductor layer which includes a cell region portion and a junction terminating region portion, the junction terminating region portion being a region portion which is positioned in an outer periphery of the cell region portion to maintain a breakdown voltage by extending a depletion layer to attenuate an electric field;

a second—first conductivity type semiconductor layer which is formed on one surface of the first-first conductivity type semiconductor layer;

a first main electrode which is electrically connected to the second—first conductivity type semiconductor layer;

first—second conductivity type semiconductor layers which are formed in the cell region portion of the first—first conductivity type semiconductor layer in substantially vertical directions to the one surface of the first—first conductivity type semiconductor layer, respectively, and which are periodically disposed in a first direction which is an arbitrary direction parallel to the one surface;

a second—second conductivity type semiconductor layer which is selectively formed in the other surface portion of the first—first conductivity type semiconductor layer so as to contact the first—second conductivity type semiconductor layers;

a third—first conductivity type semiconductor layer which is selectively formed in the surface portion of the second—second conductivity type semiconductor layer;

a second main electrode which is formed so as to contact the second—second conductivity type semiconductor layer and the third—first conductivity type semiconductor layer;

a control electrode which is formed on the surface of the first—first conductivity type semiconductor layer sandwiched by the adjacent second—second conductivity type semiconductor layers, the surface of the adjacent second—second conductivity type semiconductor layers and the surface of the third—first conductivity type semiconductor layer, with a gate insulating film interposed therebetween; and third—second conductivity type semiconductor layers which are formed in the junction terminating region portion and are periodically disposed in at least one direction of the first direction and a second direction perpendicular to the first direction.

According to a second aspect of the invention, there is provided a method of manufacturing a semiconductor device having a super junction structure with a first conductivity type semiconductor layer on which a trench groove whose aspect ratio is R is provided and a second conductivity type semiconductor layer which is buried in the trench groove, the method of manufacturing the semiconductor device comprising:

forming a trench groove having an aspect ratio of R/N (N is a natural number greater than 1) in a first conductivity type semiconductor layer;

epitaxially growing a second conductivity type semiconductor layer so as to bury the trench groove;

removing the second conductivity type semiconductor layer until a surface of the first conductivity type semiconductor layer is exposed;

epitaxially growing the first conductivity type semiconductor layer on the first conductivity type semiconductor layer and the second conductivity type semiconductor layer such that the thickness of the first conductivity type semiconductor layer increases by a length which is substantially the same as a depth of the trench groove formed by the first process;

selectively removing the first conductivity type semiconductor layer such that the second conductivity type semiconductor layer which is buried in the trench groove formed by the first process is exposed; and repeating the epitaxially growing the second conductivity type semiconductor layer through selectively removing the first conductivity type semiconductor layer (N−1) times.

DETAILED DESCRIPTION OF THE INVENTION

Several embodiments of the present invention will be described with reference to the drawings. Hereinafter, first, embodiments of a semiconductor device according to the present invention will be described, and finally, an embodiment of a method of manufacturing the semiconductor device according to the present invention will be described.

(A) Embodiments of the Semiconductor Device

Hereinafter, a power MOSFET having a super junction structure will be described. However, the semiconductor device according to the present invention is not limited to a power MOSFET, and can be applied to an SBD or MPS diode having a super junction structure, a switching element such as an SIT, a JFET, an IGBT, or the like, and a complex element or an integrated element of the diodes and the switching elements.

(1) First Embodiment

Figure 1:
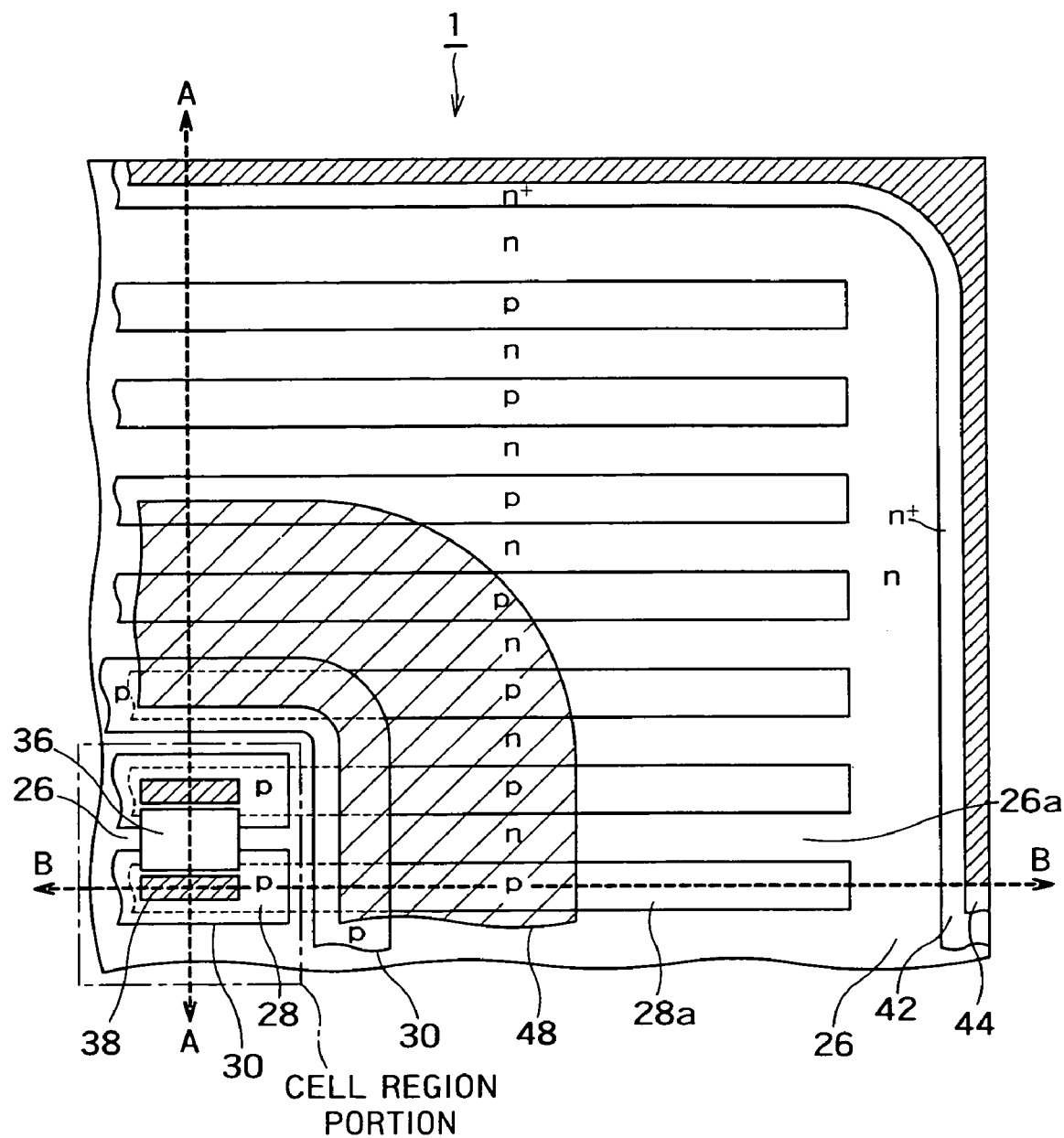
FIG. 1 is a plan view showing a schematic structure of a first embodiment of a semiconductor device according to the present invention.
Figure 2:
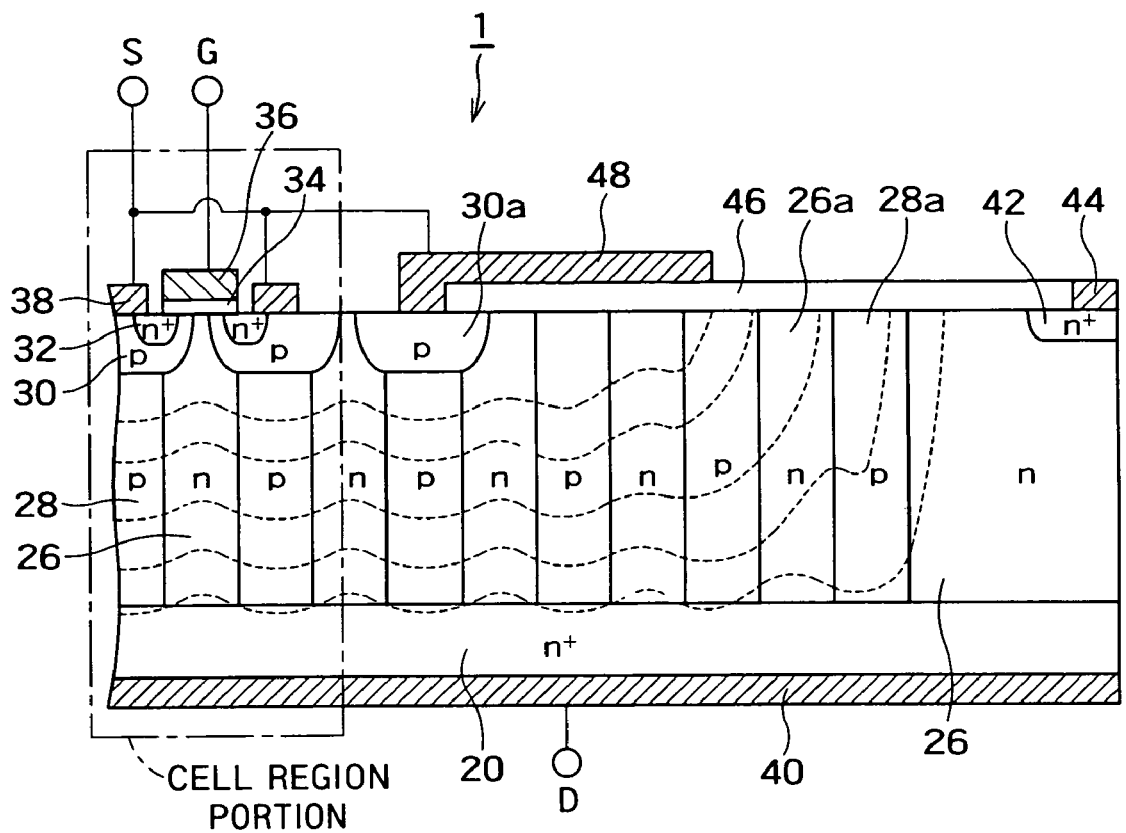
FIG. 2 is a cross-sectional view taken along the cutting line A—A of the semiconductor device shown in FIG. 1.
Figure 3:
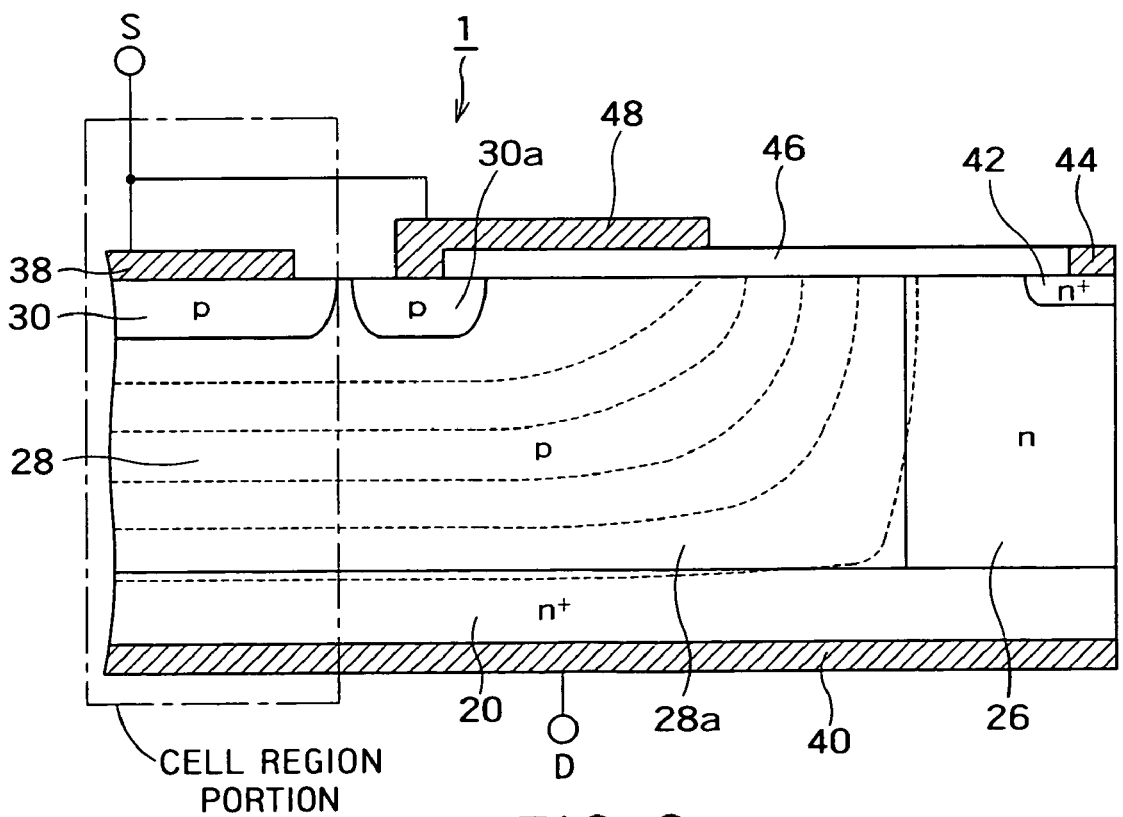
FIG. 3 is a cross-sectional view taken along the cutting line B—B of the semiconductor device shown in FIG. 1.
Figure 36:
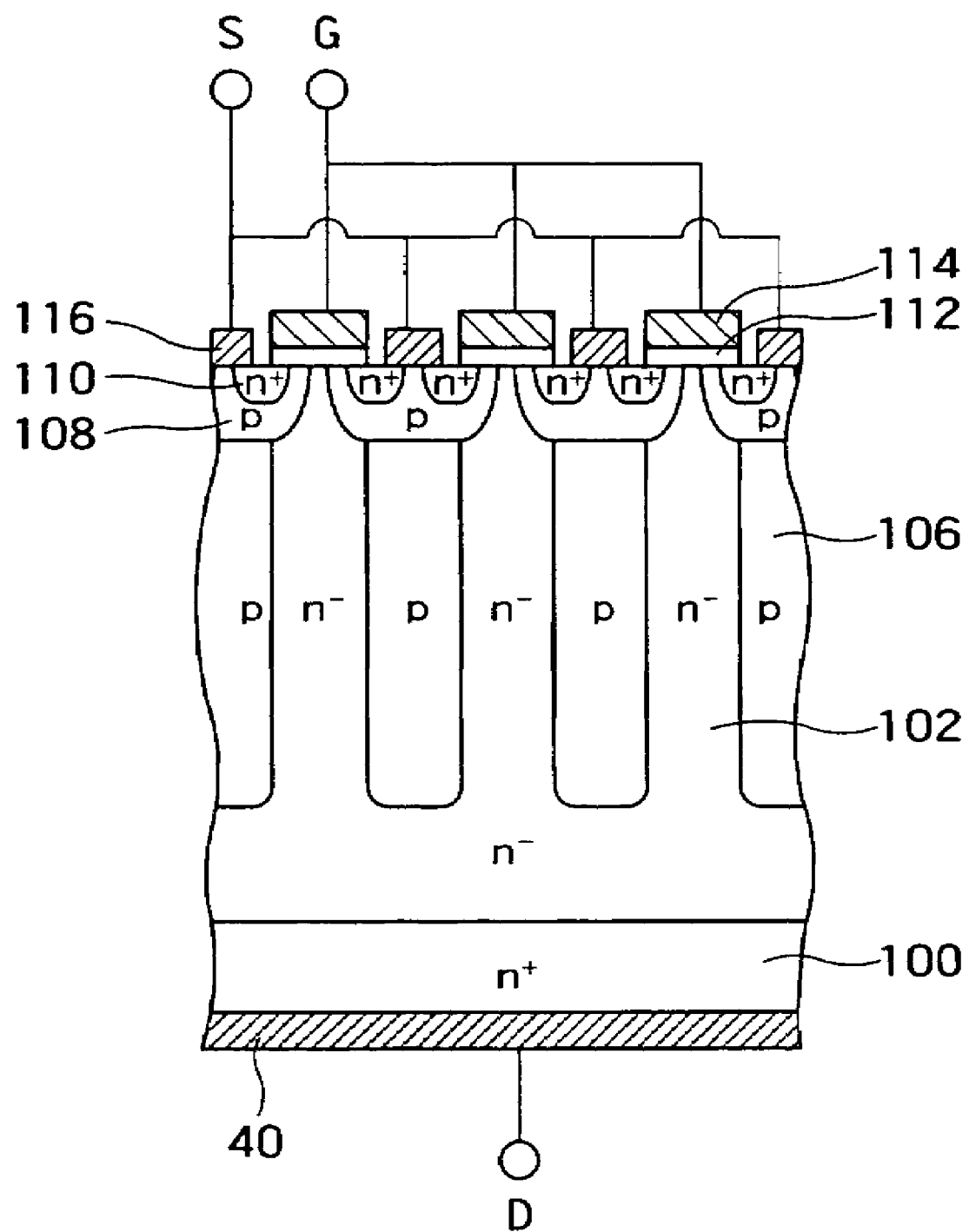
FIG. 36 is a cross-sectional view showing a schematic structure of a power MOSFET having a super junction structure in accordance with a prior art.

FIG. 1 is a plan view showing a schematic structure of a first embodiment of the semiconductor device according to the present invention. FIG. 2 and FIG. 3 are cross-sectional views of the semiconductor device of the present embodiment along taken along the cutting lines A—A and B—B of FIG. 1, respectively. As is clear in comparison with FIG. 36, the semiconductor device 1 of the present embodiment is characterized in that n-type drift layers 26 and p-type drift layers 28 are formed not only in a cell region portion, but are formed also up to the vicinity of the periphery of a junction terminating region portion. Hereinafter, the structure of the semiconductor device 1 of the present embodiment will be described in even more detail.

The semiconductor device 1 of the present embodiment has an n+ type drain layer 20, a drain electrode 40, the n type drift layers 26, the p type drift layers 28, p type base layers 30, an n+ type source layer 32, a source electrode 38, an insulated gate electrode 36, and a fieldplate electrode 48.

The drain electrode 40 is formed on one surface of the n+ type drain layer 20, and is formed on the bottom surface in FIG. 2 and FIG. 3. The p type drift layers 28 are respectively structured in the n type semiconductor layers 26 so as to be in a striped shape from the boundary surface with the n+ type drain layer 20 up to the surface portion of the n type semiconductor layers 26 which represent the other surface portion, i.e., the top surface portion in FIG. 2 and FIG. 3, of the n+ type drain layer 20. The respective stripe-shaped p type drift layers 28 are arranged not only in the cell region portion, but also up to the junction terminating region portion at predetermined intervals in a predetermined direction which is horizontal to the surface of the n+ type drain layer 20. Regions sandwiched between these p type drift layers 28 in the n type semiconductor layers 26 structure the n type drift layers 26. With respect to the widths and the impurity concentration of both of the n type semiconductor layers 26 and the p type drift layers 28, for example, when each of their widths is 5 μm, the impurity concentration is about $4 \times 10^{15}$ cm$^{-3}$, respectively, and when each of the widths is 1 μm, the impurity concentration is about $2 \times 10^{16}$ cm$^{-3}$, respectively.

The p type base layers 30 are selectively formed in the surface portion in the n type semiconductor layers 26 so as to connect to the p type drift layers 28. The n+ type source layers 32 are selectively formed in the surface portion of the p type base layers 30. The source electrodes 38 are formed so as to connect the adjacent n+ type source layer 32 on the surface of the p type base layer 30 and the p type base layer 30 sandwiched thereby. Moreover, the insulated gate electrode 36 is disposed via an insulating film 34 above the surface of the n type drift layer 26, the surface of the p type base layer 30 adjacent to the surface of the n type drift layer 26, and the surface of the n+ source layer 32 contacting the p type base layer 30, so as to be surrounded by the source electrodes 38. In accordance with such a structure, the semiconductor device 1 constitutes an n channel MOSFET for electron injection in which the surface portion of the p type base layer 30 immediately under the insulated gate 36 is a channel region. In the present embodiment, a case in which a planer type gate structure is provided will be described. However, a trench type gate structure may be used. This point is the same for the following respective embodiments as well.

The semiconductor device 1 also comprises a p type base layer 30a which is formed so as to surround the cell region portion in the surface portion at the vicinity of the boundary with the cell region portion in the junction terminating region portion. The p type base layer 30a is discretely connected to the p type drift layer 28a which is closest to the cell region portion among the p type drift layers 28a provided in the junction terminating region portion. On the surface of the junction terminating region portion, an insulating film 46 is formed on the part other than a part of the p type base layer 30a. A fieldplate electrode 48 is formed on the insulating film 46 so as to surround the cell region, and contacts the surface of the p type base layer 30a, and is electrically connected to the source electrodes 38. In the periphery of the junction terminating region, a high-concentration n+ type channel stopper layer 42 is formed on the surface portion of the n type drift layer 26, and the electrode 44 is formed on the n+ channel stopper layer 42.

The broken lines in FIG. 2 and FIG. 3 denote equipotential lines, which are the result of a simulation in which calculation is carried out by using the conditions that the widths of the n type drift layer 26 and the p type drift layer 28 are 8 μm, the impurity concentrations thereof are $2 \times 10^{15}$ cm$^{-3}$, and the thickness thereof are 50 μm.

When the semiconductor device 1 of the present embodiment turns off in a direction (the A—A direction of FIG. 1, and hereinafter referred to as vertical direction) intersecting the stripe longitudinal direction (the B—B direction of FIG. 1, and hereinafter referred to as the horizontal direction) of the drift layers 26 (26a), 28 (28a) in plan view, the depletion progresses from a side close to the cell region portion of the n type drift layer 26a and the p type drift layer 28a toward the periphery of the device, and in the horizontal direction, the depletion progresses over the boundary surface at the same time from the device peripheral portions of the drift layers 26a and 28a to the cell region portion. At this time, electrons are discharged to the drain electrode 40 via the n+ type drain layer 20 from the n type drift layer 26a, and on the other hand, positive holes are discharged to the source electrode 38 via the p type base layer 30a and to the fieldplate electrode 48 from the p type drift layer 28a. However, in the vertical direction, the positive holes are discharged so as to cross the junction between the n type drift layer 26a and the p type drift layer 28a. Moreover, in a blocking state (at the time when the device is off), because the intervals between the equipotential lines are made uniform by the fieldplate electrode 48, as shown in FIG. 2 and FIG. 3, the electric field is attenuated thereby. As a result, the semiconductor device 1 can obtain a stable high breakdown voltage.

Note that the structure of the n type drain layer 20 is not limited to the form shown in FIG. 1 through FIG. 3, and for example, an epitaxial wafer substrate, a layer in which a predetermined depth of the epitaxial wafer substrate is subjected to thermal diffusion, a diffusion layer in which an impurity is subjected to thermal diffusion, or the like can be applied. Further, the present embodiment is the two-layer structure of the n type drain layer 20 and the n type semiconductor layer 26. However, an intermediate layer whose concentration continuously changes may be set between these two layers. Further, in the present embodiment, as shown in FIG. 2 and FIG. 3, the fieldplate electrode 48 is formed on the insulating film 46 having a uniform thickness. However, the present invention is not limited thereto, and for example, as in eleventh through sixteenth embodiments which will be described later, it may be set such that the thickness of the insulating film 46 is made to gradually become greater as the insulating film 46 approaches the peripheral portion. These points are the same for following second through tenth embodiments as well.

(2) Second Embodiment

Figure 4:
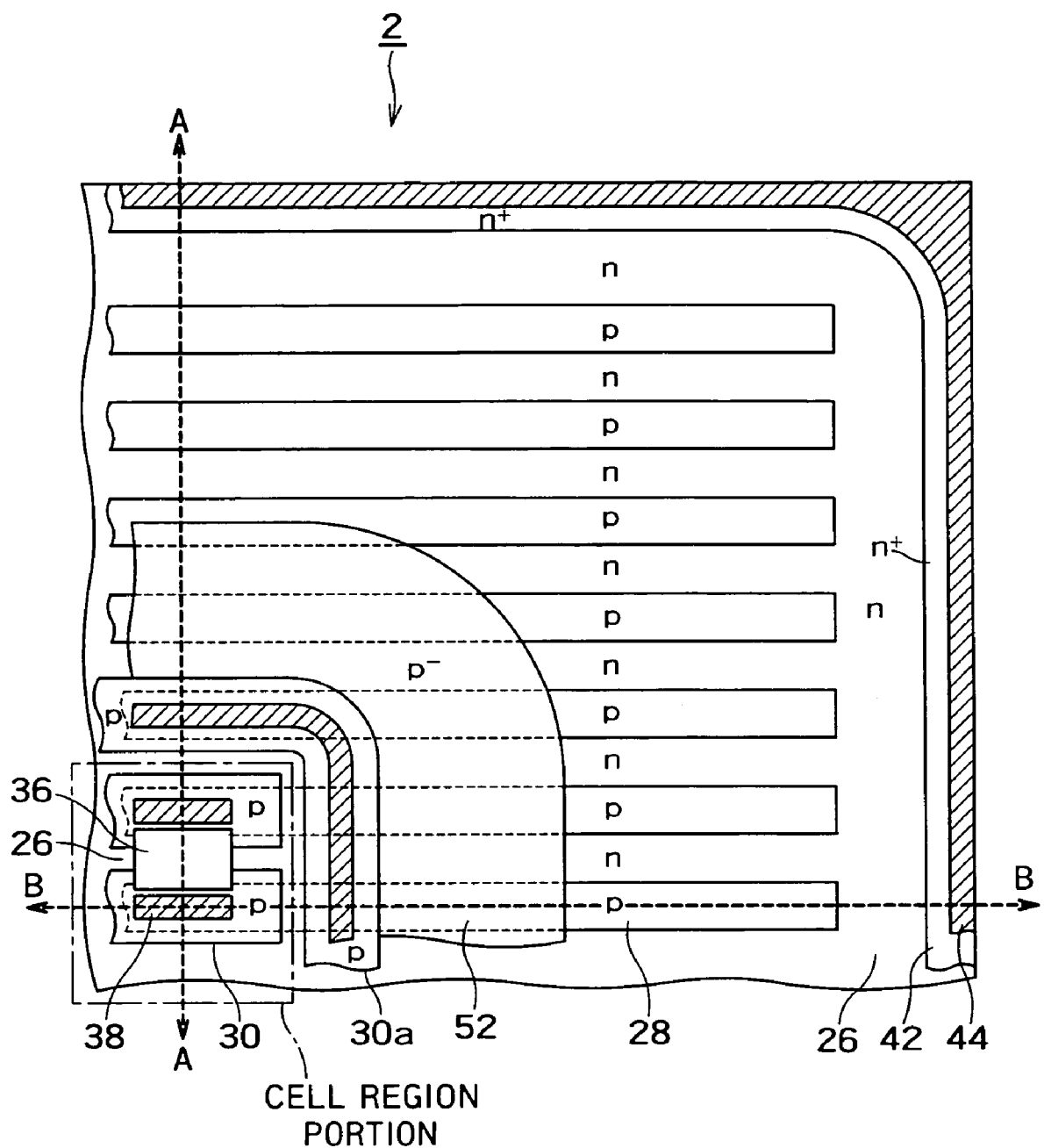
FIG. 4 is a plan view showing a schematic structure of a second embodiment of a semiconductor device according to the present invention.
Figure 5:
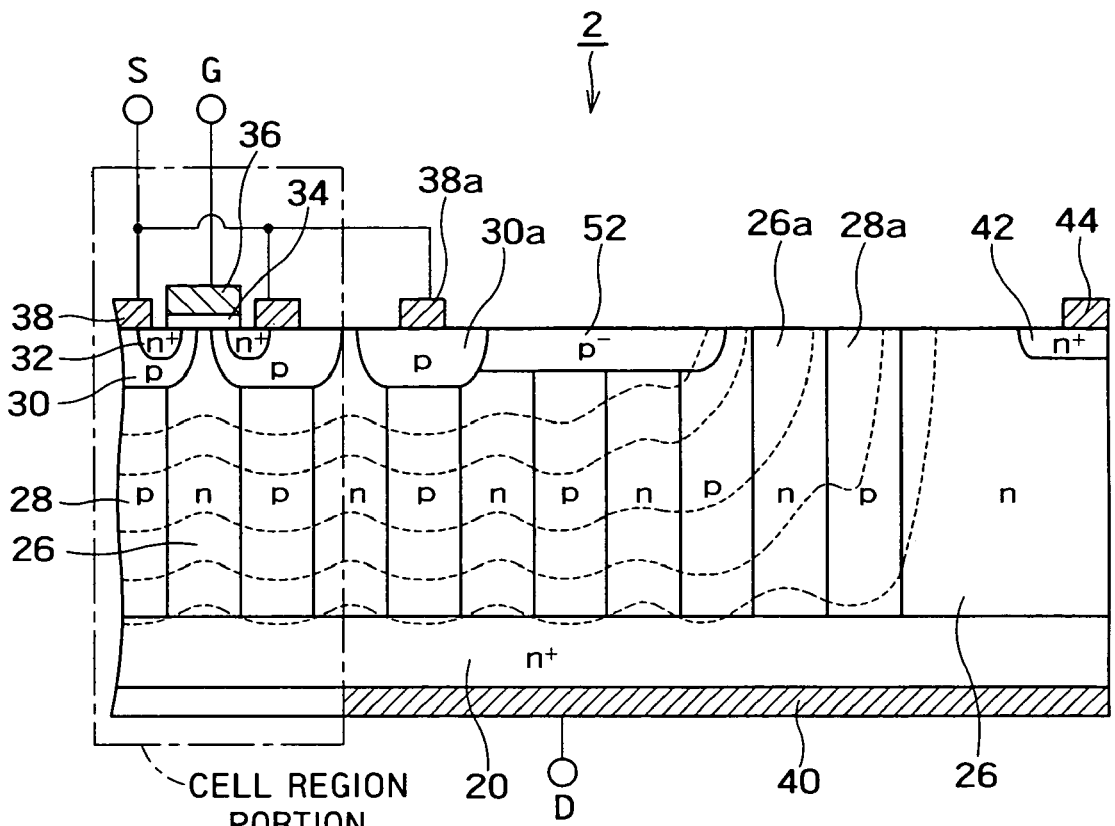
FIG. 5 is a cross-sectional view taken along the cutting line A—A of the semiconductor device shown in FIG. 4.
Figure 6:
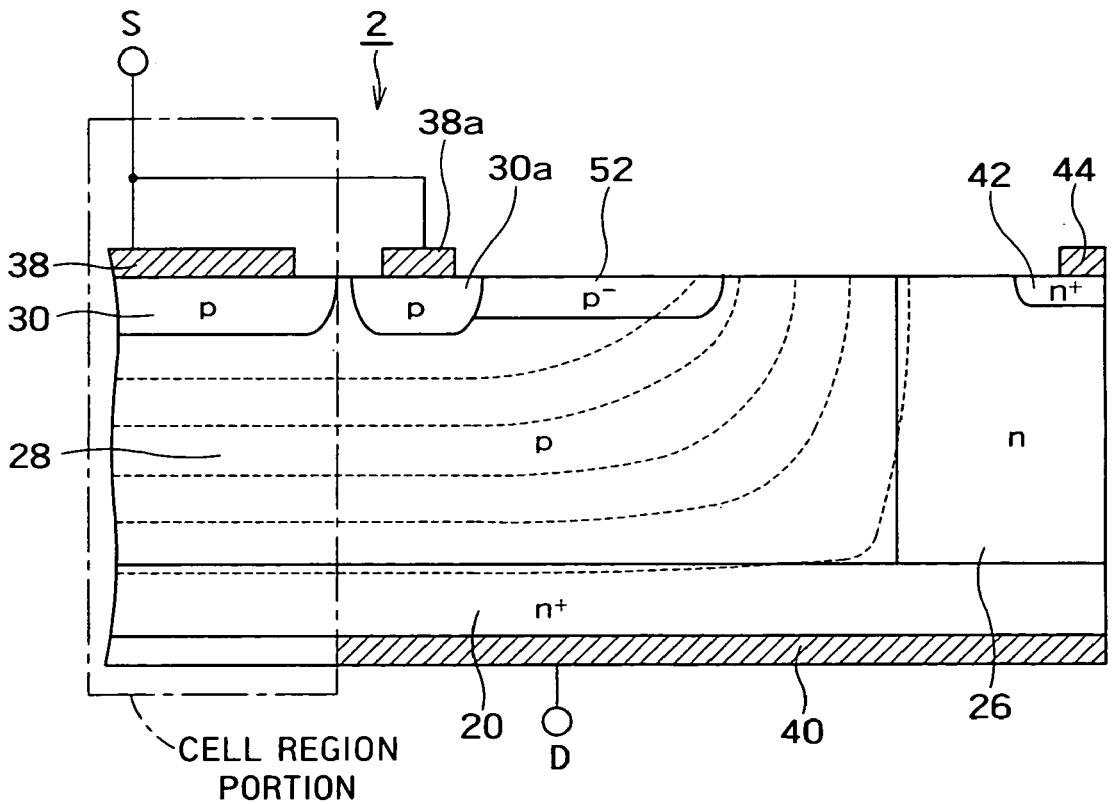
FIG. 6 is a cross-sectional view taken along the cutting line B—B of the semiconductor device shown in FIG. 4.

FIG. 4 is a plan view showing a schematic structure of a second embodiment of a semiconductor device according to the present invention. FIG. 5 and FIG. 6 are cross-sectional views of the semiconductor device of the present embodiment taken along the cutting lines A—A and B—B of FIG. 4, respectively.

The semiconductor device 2 of the present embodiment has, in place of the fieldplate electrode 48 which the semiconductor 1 shown in FIG. 1 has, a p− type resurf layer 52 which is connected to the p type base layer 30a disposed so as to surround the cell region in the junction terminating region portion, and which is formed so as to further surround the p type base layer 30a. The other structures of the semiconductor device 2 are substantially the same as those of the semiconductor device 1 shown in FIG. 1.

As shown by the equipotential lines in FIG. 2 and FIG. 3, also by providing such a p− type resurf layer 52, the electric field is attenuated at the time when the device is off. Therefore, a stable high breakdown voltage can be obtained.

(3) Third Embodiment

Figure 7:
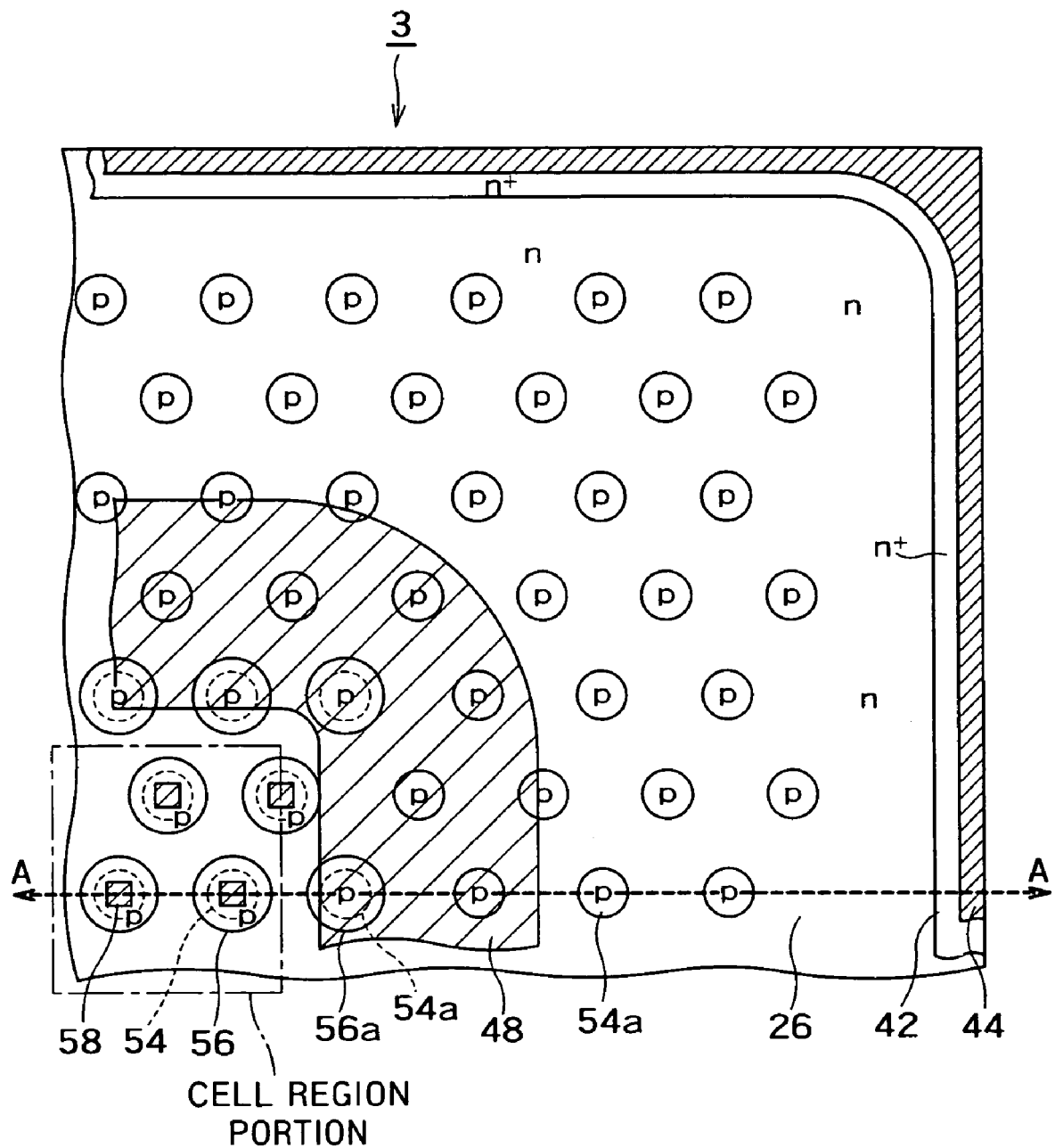
FIG. 7 is a plan view showing a schematic structure of a third embodiment of a semiconductor device according to the present invention.

FIG. 7 is a plan view showing a schematic structure of a third embodiment of a semiconductor device according to the present invention. Note that across-sectional view taken along the cutting line A—A in the view is substantially the same as FIG. 2.

The semiconductor device 3 of the present embodiment is characterized in that p type drift layers 54, 54a have a circular plane shape, which is different from the above-described embodiments. Due to the p type drift layers being structured in such a shape, the depletion layers can be extended in all directions in a plane which is horizontal to the surface of the device.

Note that, in FIG. 7, although an example of circular patterns is shown, there may be polygonal patterns such as quadrangular patterns, hexagonal patterns, or the like. Further, it may be formed such that the n type drift layers 26 have a pattern. Further, in the same way as in the above-described second embodiment, a resurf layer can be applied in place of the fieldplate electrode 48.

(4) Fourth Embodiment

Figure 8:
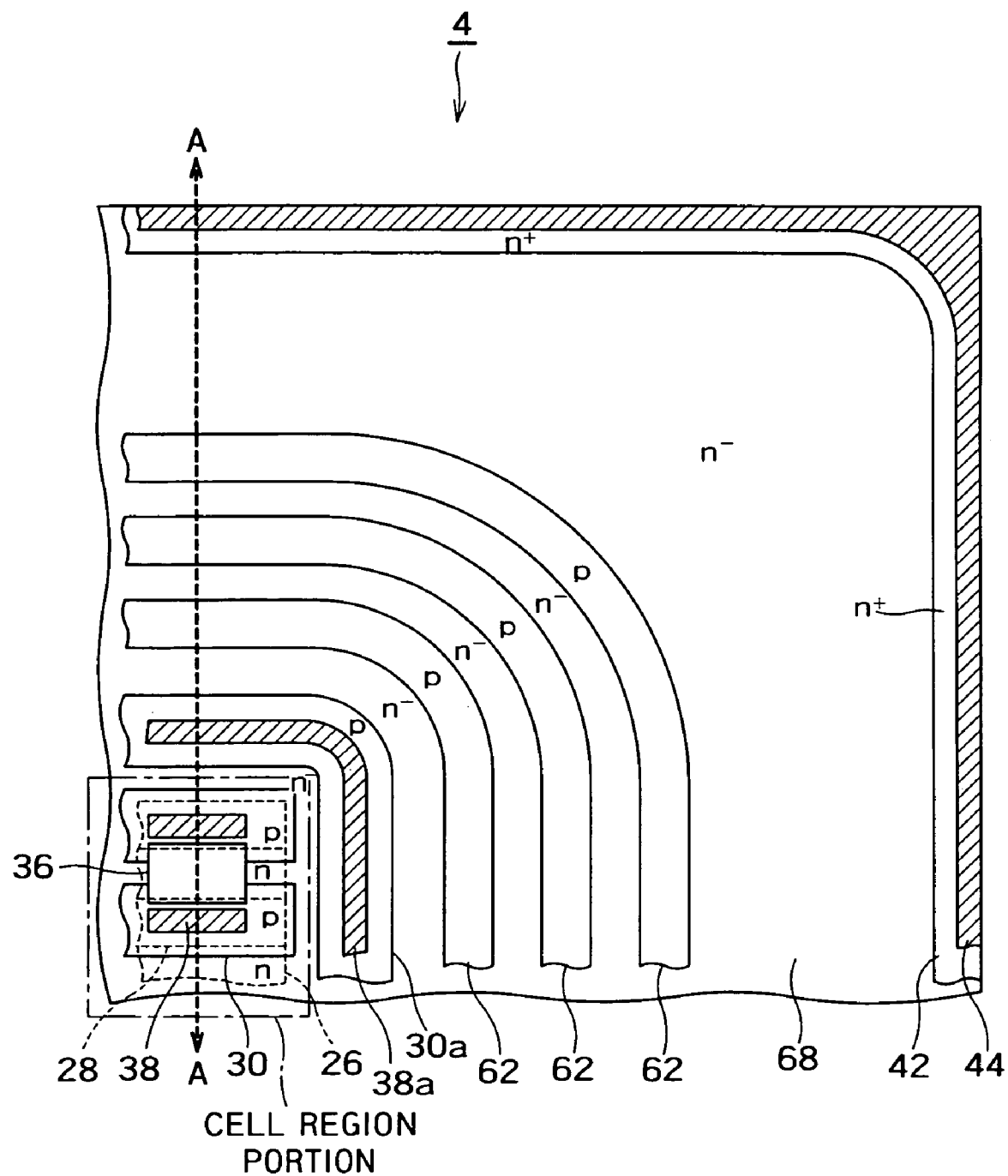
FIG. 8 is a plan view showing a schematic structure of a fourth embodiment of a semiconductor device according to the present invention.
Figure 9:
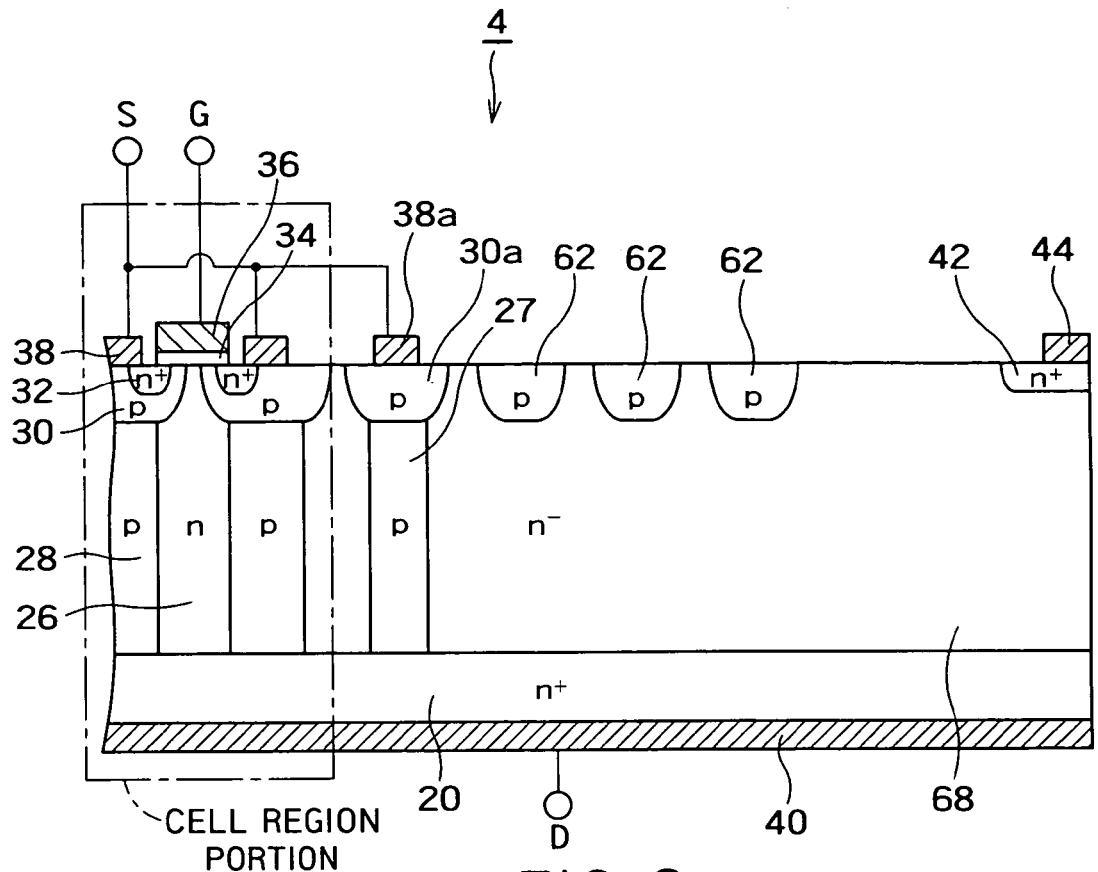
FIG. 9 is a cross-sectional view taken along the cutting line A—A of the semiconductor device shown in FIG. 8.

FIG. 8 is a plan view showing a schematic structure of a fourth embodiment of a semiconductor device according to the present invention. FIG. 9 is a cross-sectional view of the semiconductor device of the present embodiment taken along the cutting line A—A of FIG. 8.

Differently from the above-described first though third embodiments, a semiconductor device 4 of the present embodiment has an n– type base layer 68 as the n type base layer in the junction terminating region portion, the concentration of the n– type base layer 68 being lower than that of the n type drift layer 26 in the cell region portion. Moreover, the semiconductor device 4 does not have drift layers in the junction terminating region portion other than a p type drift layer 27 which will be described later. The p type base layer 30a and a plurality of p type guard ring layers 62 are selectively formed so as to surround the cell region portion in the surface portion of the n– type base layer 68. Below the p type base layer 30a, the p type drift layer 27 is formed so as to correspond to the arrangement of the p type base layer 30a, and thus, the p type base layer 30a is connected to the drain electrode 40 via the drain layer 20.

In this way, in accordance with the present embodiment, even when a plurality of drift layers are not provided in the junction terminating region portion, a stable high breakdown voltage can be obtained by a single super junction structure surrounding the cell region portion and the p type guard ring layers 62 formed so as to surround the cell region portion in the same way in the surface portion of the periphery of the super junction structure.

Figure 10:
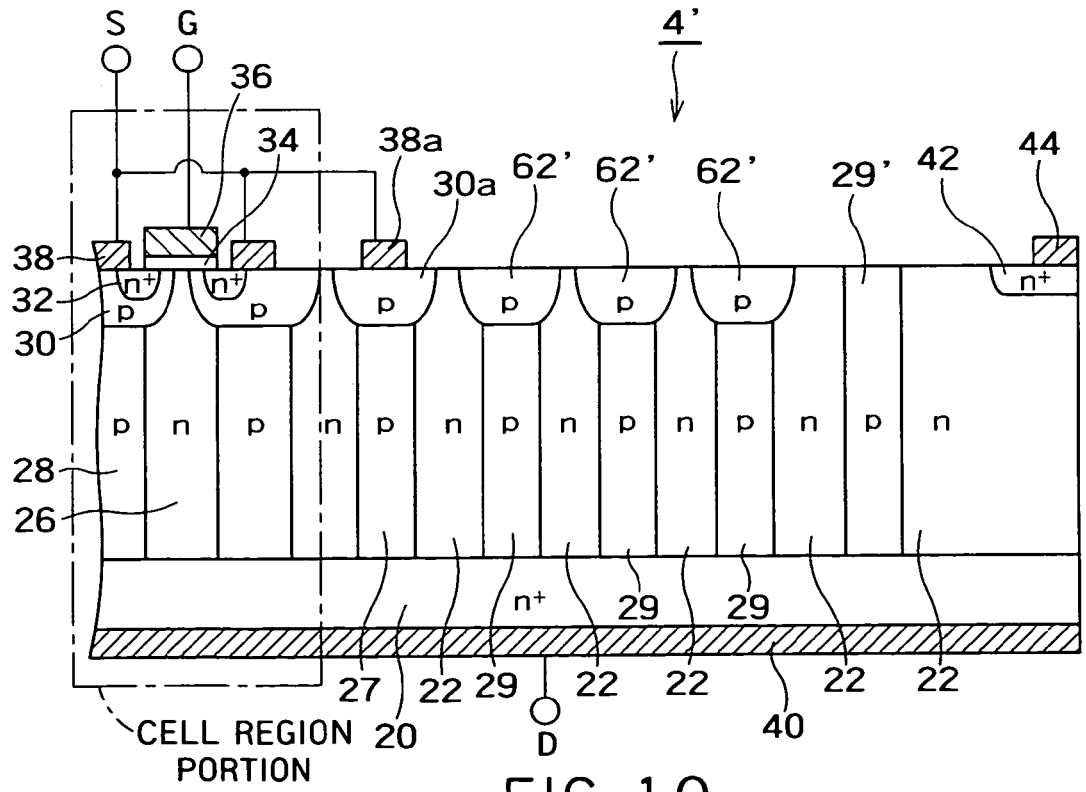
FIG. 10 is a cross-sectional view showing a modified example of the semiconductor device shown in FIG. 8.

A cross-sectional view of a modified example of the present embodiment is shown in FIG. 10. A semiconductor device 4' shown in the view has, in the junction terminating region portion, n type base layers 22 whose concentration is the same as that of the n type drift layer 26 in the cell region portion, and p type drift layers 29 are provided in the junction terminating region portion and are connected to p type guard ring layers 62' which are selectively provided on the surface portion of the n type base layers 22. Moreover, in the peripheral portion of the junction terminating region portion, a p type drift layer 29' is formed so as to be exposed on the surface of the n type base layers 22. In accordance with these structures, a stable high breakdown voltage can be obtained because the equipotential lines spreading in the junction terminating region portion are made flat. As a result, a decrease of the breakdown voltage in the junction terminating region portion can be suppressed.

(5) Fifth Embodiment

Figure 11:
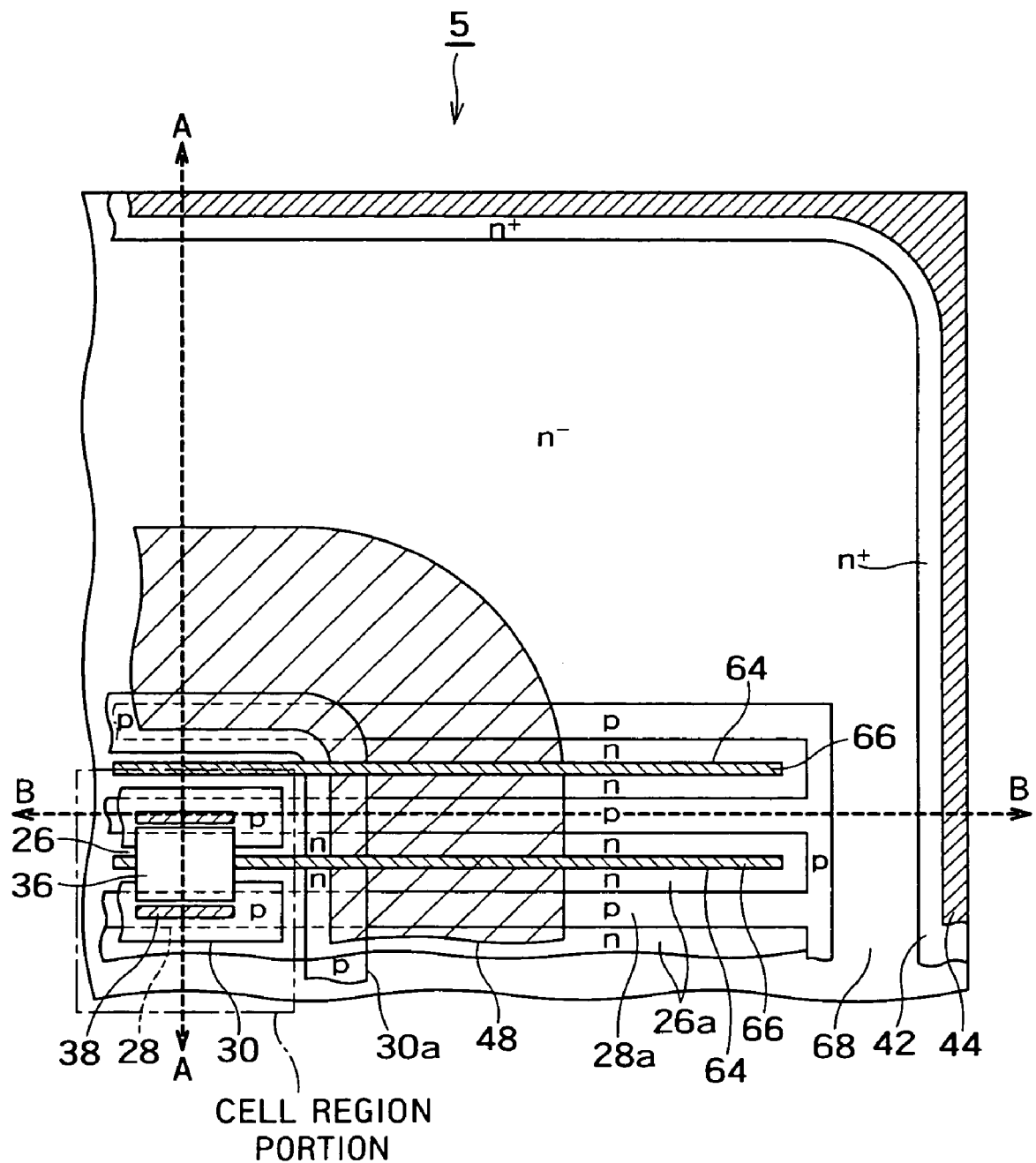
FIG. 11 is a plan view showing a schematic structure of a fifth embodiment of a semiconductor device according to the present invention.
Figure 12:
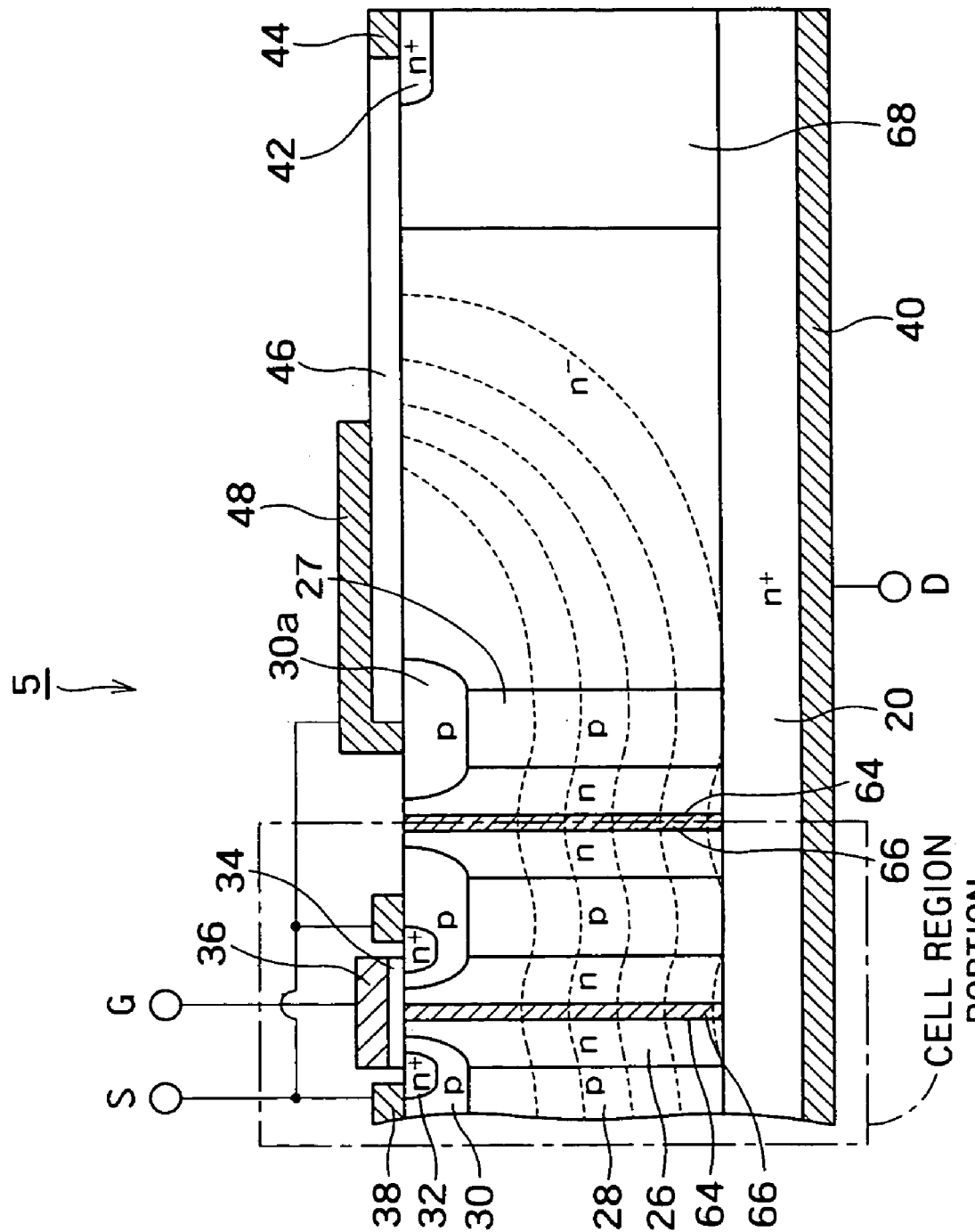
FIG. 12 is a cross-sectional view taken along the cutting line A—A of the semiconductor device shown in FIG. 11.

FIG. 11 is a plan view showing a schematic structure of a fifth embodiment of a semiconductor device according to the present invention. FIG. 12 is a cross-sectional view of the semiconductor device of the present embodiment taken along the cutting line A—A of FIG. 11. Note that the cross-sectional view taken along the cutting line B—B of FIG. 11 is the same as the FIG. 3.

The present embodiment provides a junction terminating regional structure which is suitable for a semiconductor device having an insulating film formed parallel to the horizontal direction in the n type drift layer 26 in the cell region portion.

As shown in FIG. 11 and FIG. 12, in the semiconductor device 5 of the present embodiment, a trench groove 64 is formed in a horizontal direction in the n type drift layer 26 (26a), and an insulating film 66 is formed therein. Such an insulating film can be manufactured by forming the stripe shaped trench grooves 64 so as to extend from the cell region portion to the junction terminating region portion on the substrate structured from, for example, a low-concentration n– type base layer 68, and by applying thermal diffusion after an n type impurity and a p type impurity are introduced into the side walls of the trench grooves 64 by using a method such as an ion injection or the like. Thereby, the n type drift layer 26 (26a) and the p type drift layer 28 (28a) are formed so as to surround the insulating film 66. Accordingly, in the junction terminating region portion, the insulating film 66 and the both drift layers 26a, 28a extend in the horizontal direction up to the vicinity of the peripheral portion. However, the insulating film 66 and the drift layers are not formed in the vertical direction.

This is because that, if the insulating film 66 and the drift layers 26a, 28a are formed in the vertical direction, the positive holes in the p type drift layer 28a are not discharged at the time of turning-off because of the insulating film 66, and as a result, the depletion layer does not extend and an electric field concentrates at the cells at the outermost periphery, which may break the device.

As shown in FIG. 12, the semiconductor device 5 of the present embodiment further comprises the field plate electrode 48 provided above the low-concentration n– type base layer 68 in the junction terminating region via the insulating film 46 so as to surround the cell region. Therefore, the depletion layer sufficiently extends, and a high breakdown voltage can be obtained.

(6) Sixth Embodiment

Figure 13:
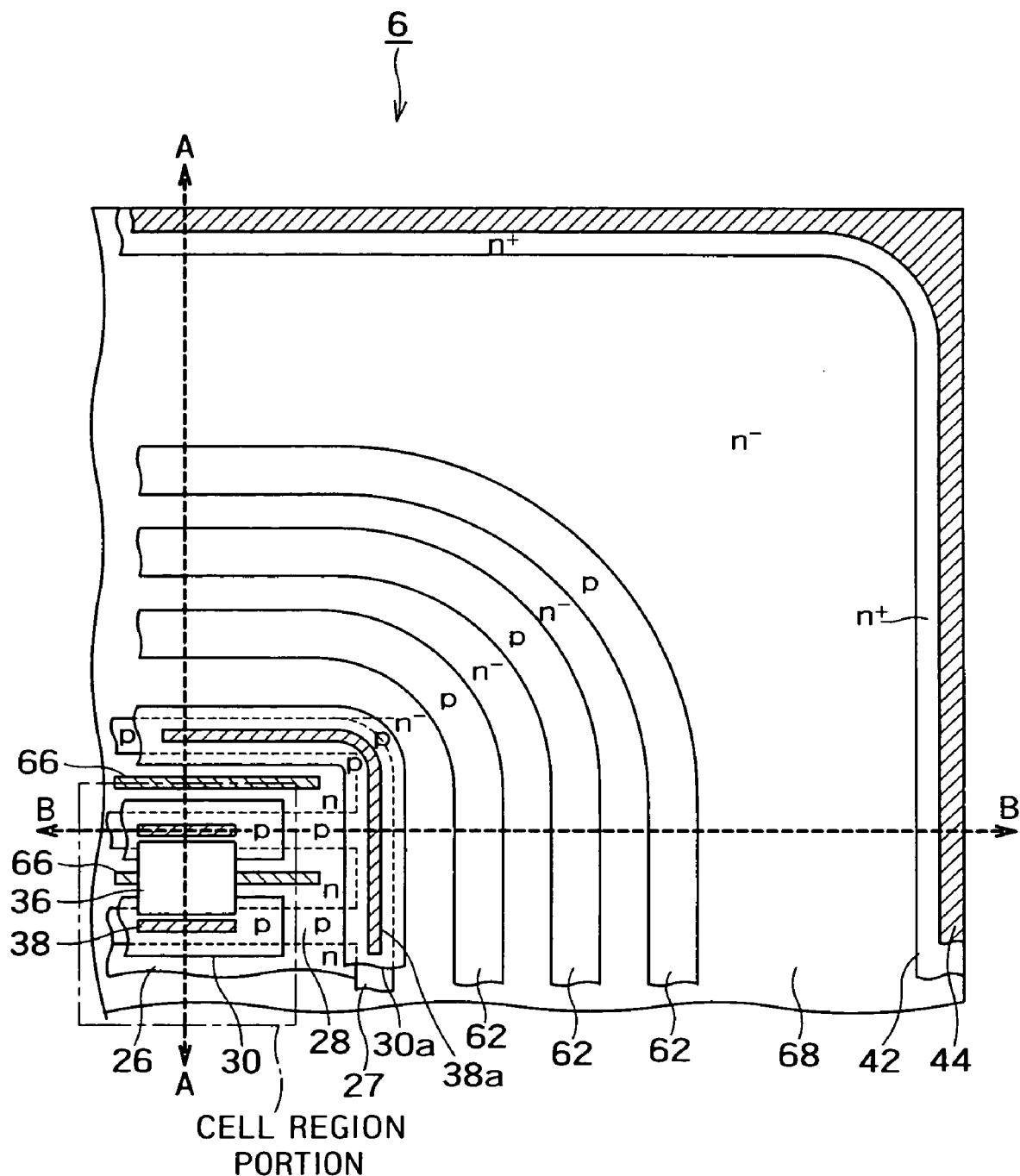
FIG. 13 is a plan view showing a schematic structure of a sixth embodiment of a semiconductor device according to the present invention.
Figure 14:
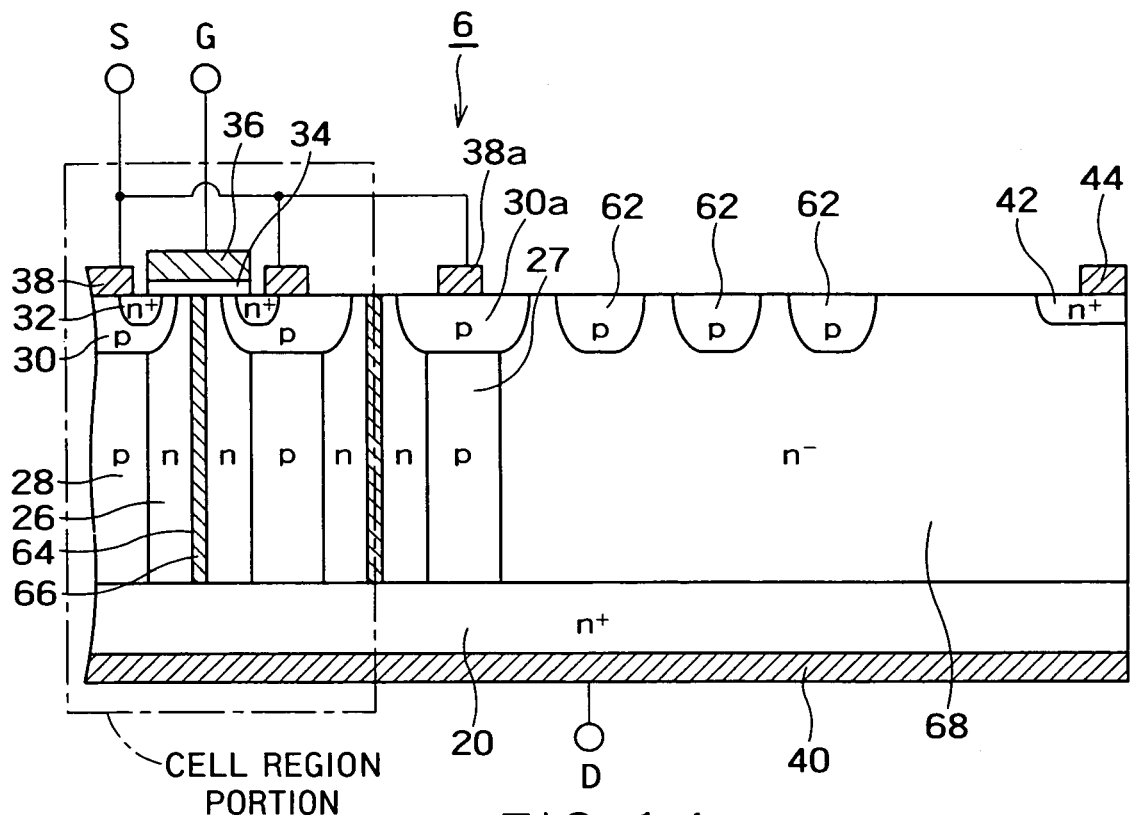
FIG. 14 is cross-sectional view taken along the cutting line A—A of the semiconductor device shown in FIG. 12.
Figure 15:
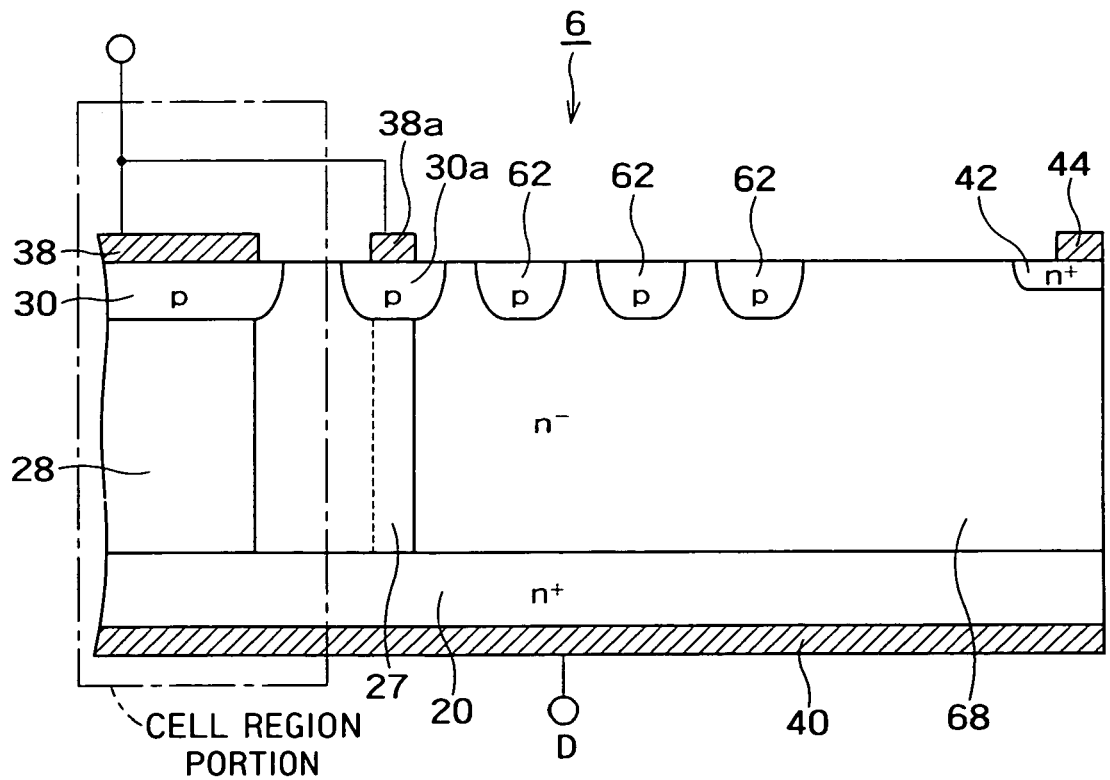
FIG. 15 is cross-sectional view taken along the cutting line B—B of the semiconductor device shown in FIG. 12.

FIG. 13 is a plan view showing a schematic structure of a sixth embodiment of a semiconductor device of the present invention. FIG. 14 and FIG. 15 are cross-sectional views of the semiconductor device of the present embodiment taken along the cutting lines A—A, B—B of FIG. 13.

Differently from the fifth embodiment which is described above, with respect to a semiconductor device 6 of the present embodiment, the insulating film 66 is formed only in the cell region portion, and does not extend to the junction terminating region portion. Moreover, in the junction terminating region portion of the semiconductor device 6, both the n type drift layers and the p type drift layers are not formed. In the present embodiment, the n– type base layer 68 whose concentration is lower than that of the n type drift layer 26 is formed in the junction terminating region portion, and the p type base layer 30a and a plurality of p type guard ring layers 62 are selectively formed so as to surround the cell region on the surface portion of the n– type base layer 68. The source electrode 38a contacts the surface of the p type base layer 30a. Further, below the p type base layer 30a, the p type drift layer 27 is formed so as to correspond to the arrangement of the p type base layer 30a, and thereby the p type base layer 30a is connected to the drain electrode 40 via the drain layer 20. In accordance with such a structure of the junction terminating region portion, the semiconductor device 6 of the present embodiment can obtain a sufficiently high breakdown voltage.

Figure 16:
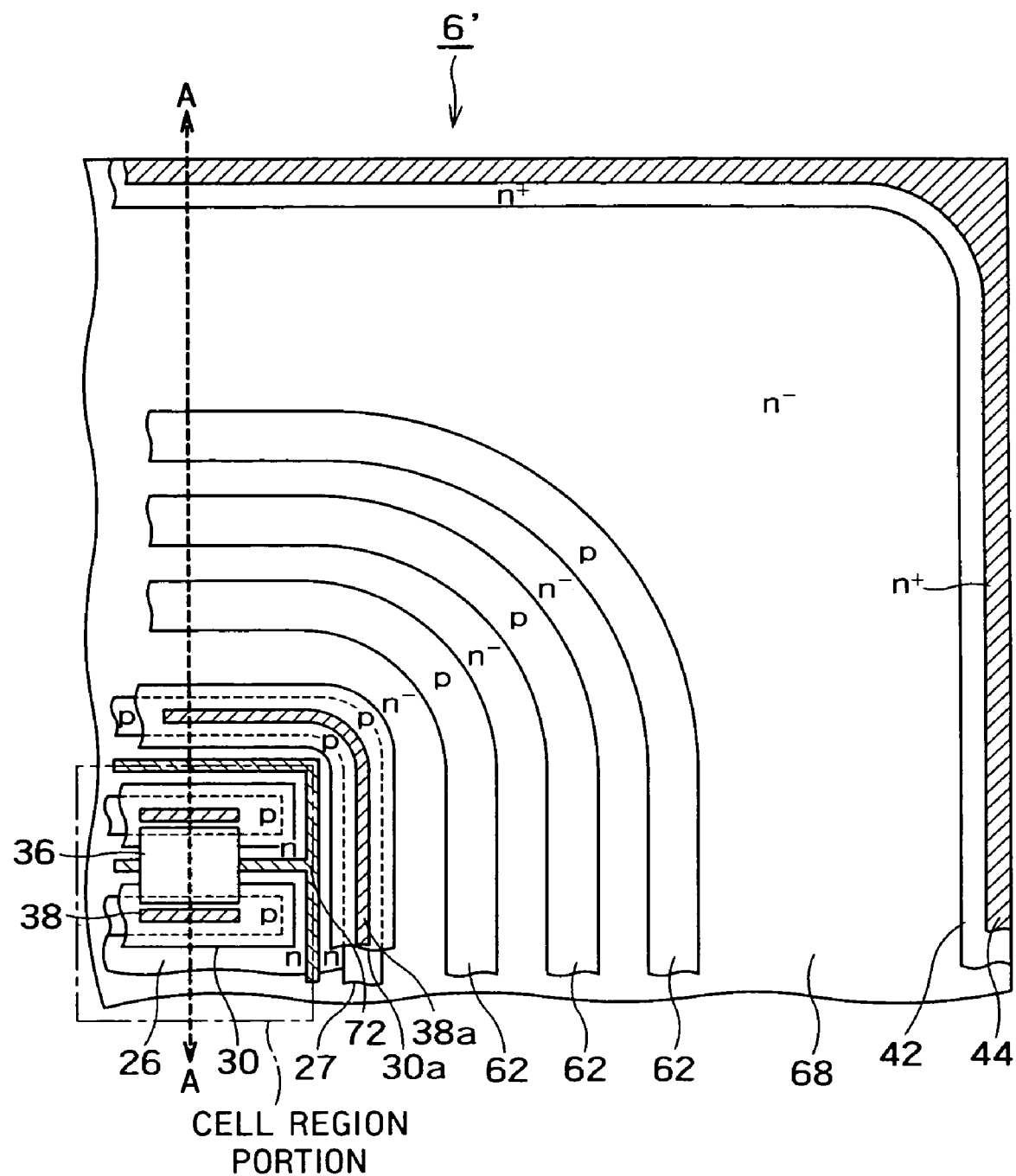
FIG. 16 is a plan view showing a modified example of the present embodiment shown in FIG. 12.

FIG. 16 is a plan view showing a modified example of the present embodiment. In a semiconductor device 6' of the present example, an insulating film 72 is formed also in a vertical direction only in the cell region portion, and then the insulating film 72 has a reticulated plan shape. Other structures of the semiconductor device 6' are substantially the same as those of the semiconductor device 6 shown in FIG. 13. Even when the insulating film 72 has such a structure in the cell region portion, the semiconductor device 6' can obtain a sufficiently high breakdown voltage because the insulating film 72 does not extend to the junction terminating region portion and the p type guard ring layers 62 are formed in the junction terminating region portion.

(7) Seventh Embodiment

Figure 17:
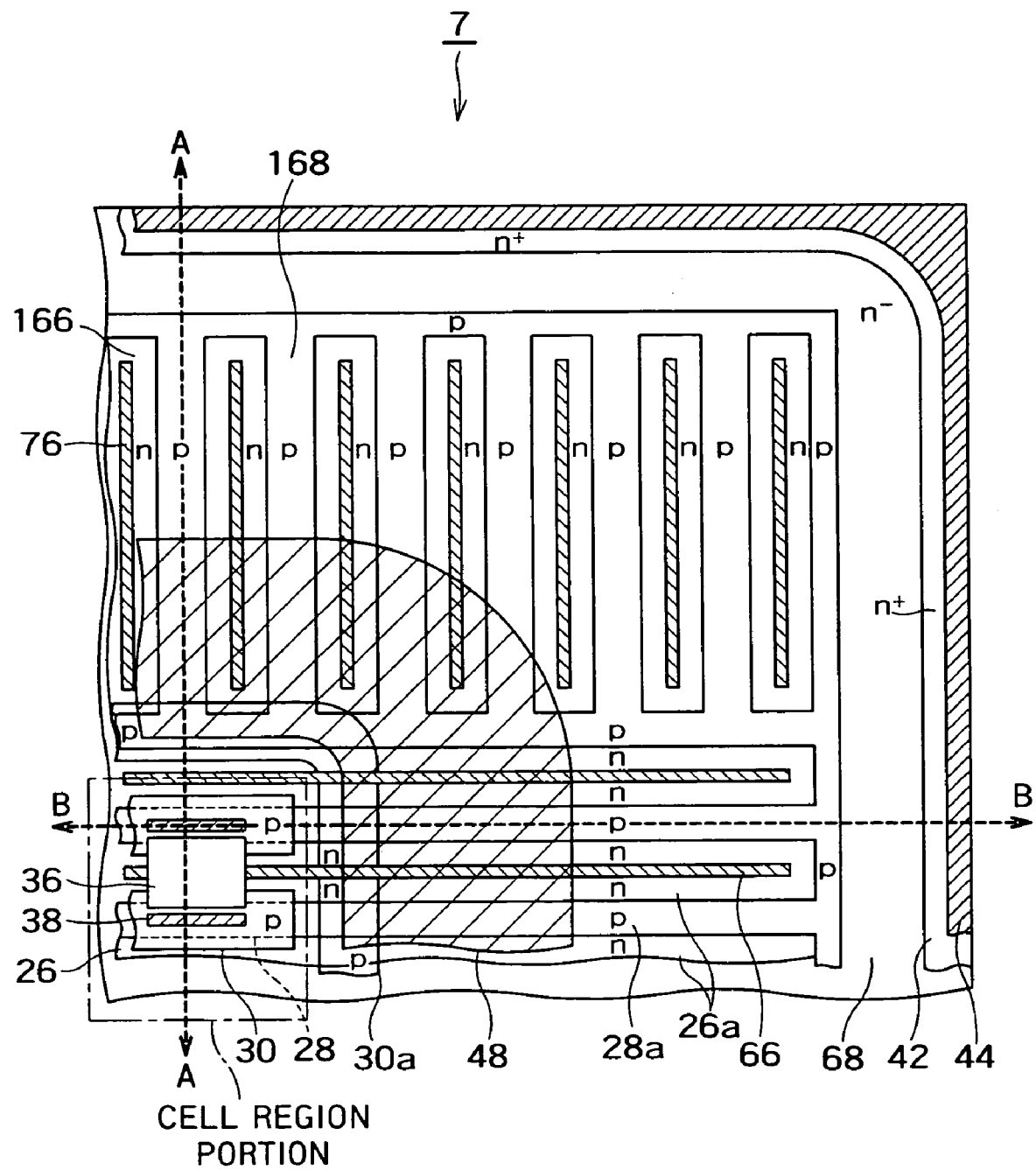
FIG. 17 is a plan view showing a schematic structure of a seventh embodiment of a semiconductor device according to the present invention.
Figure 18:
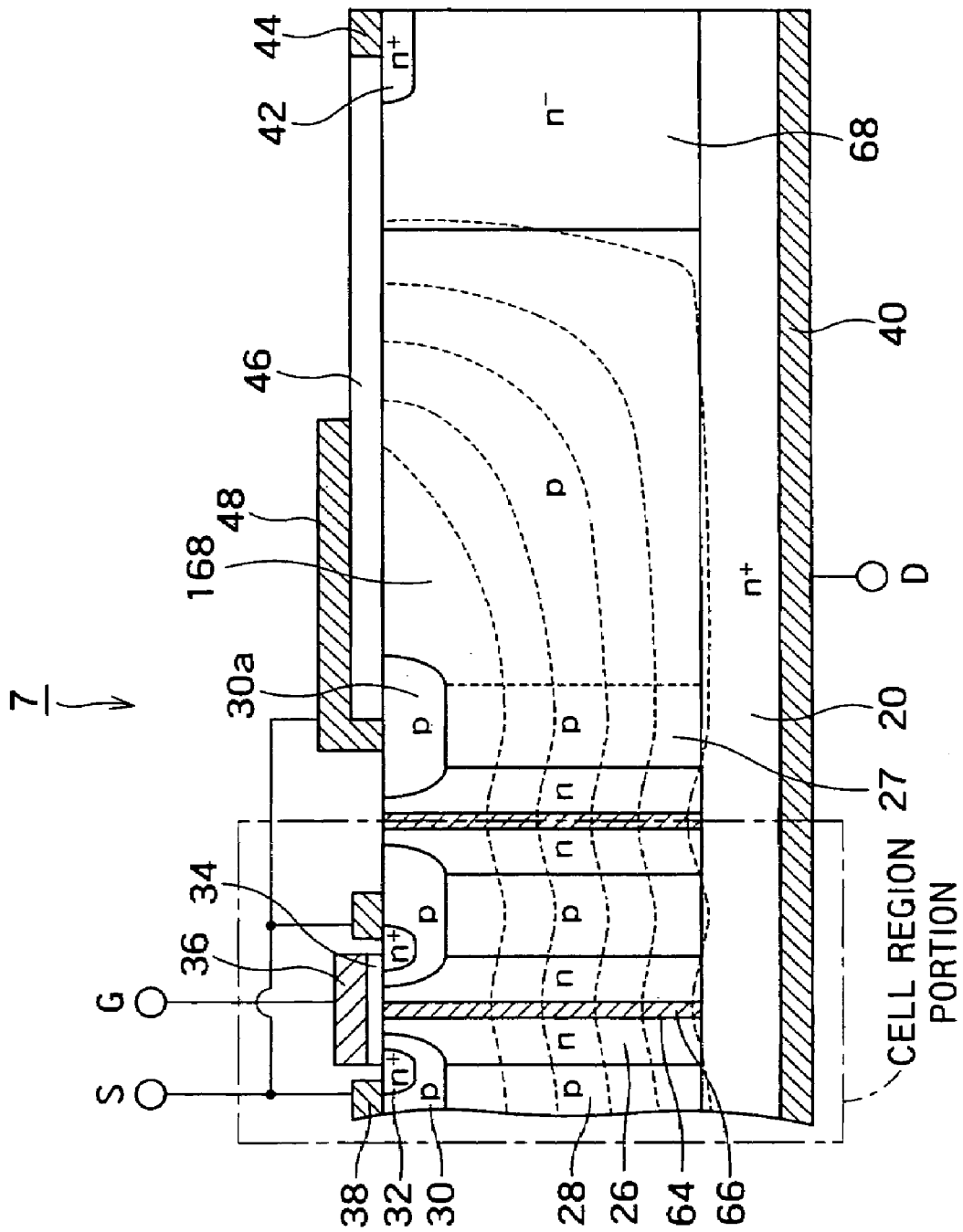
FIG. 18 is a cross-sectional view taken along the cutting line A—A of the semiconductor device shown in FIG. 17.

FIG. 17 is a plan view showing a schematic structure of a seventh embodiment of a semiconductor device according to the present invention. FIG. 18 is a cross-sectional view of the semiconductor device of the present embodiment taken along the cutting line A—A of FIG. 17. Note that the cross-sectional view taken along the cutting line B—B of FIG. 17 is the same as FIG. 3.

In addition to the structure of the semiconductor device 5 in the above mentioned fifth embodiment, a semiconductor device 7 of the present embodiment further comprises insulating films 76 formed in the vertical direction in the junction terminating region portion, and n type drift layers 166 and p type drift layers 168 which are respectively formed in the vertical direction in the junction terminating region portion and which are periodically disposed in the horizontal direction. In accordance with such a structure, the depletion layers sufficiently extend at the time of turning-off because the positive holes in the p type drift layers 168 are discharged in the vertical direction in the same way as in the horizontal direction, and a high breakdown voltage can thus be obtained.

(8) Eighth Embodiment

Figure 19:
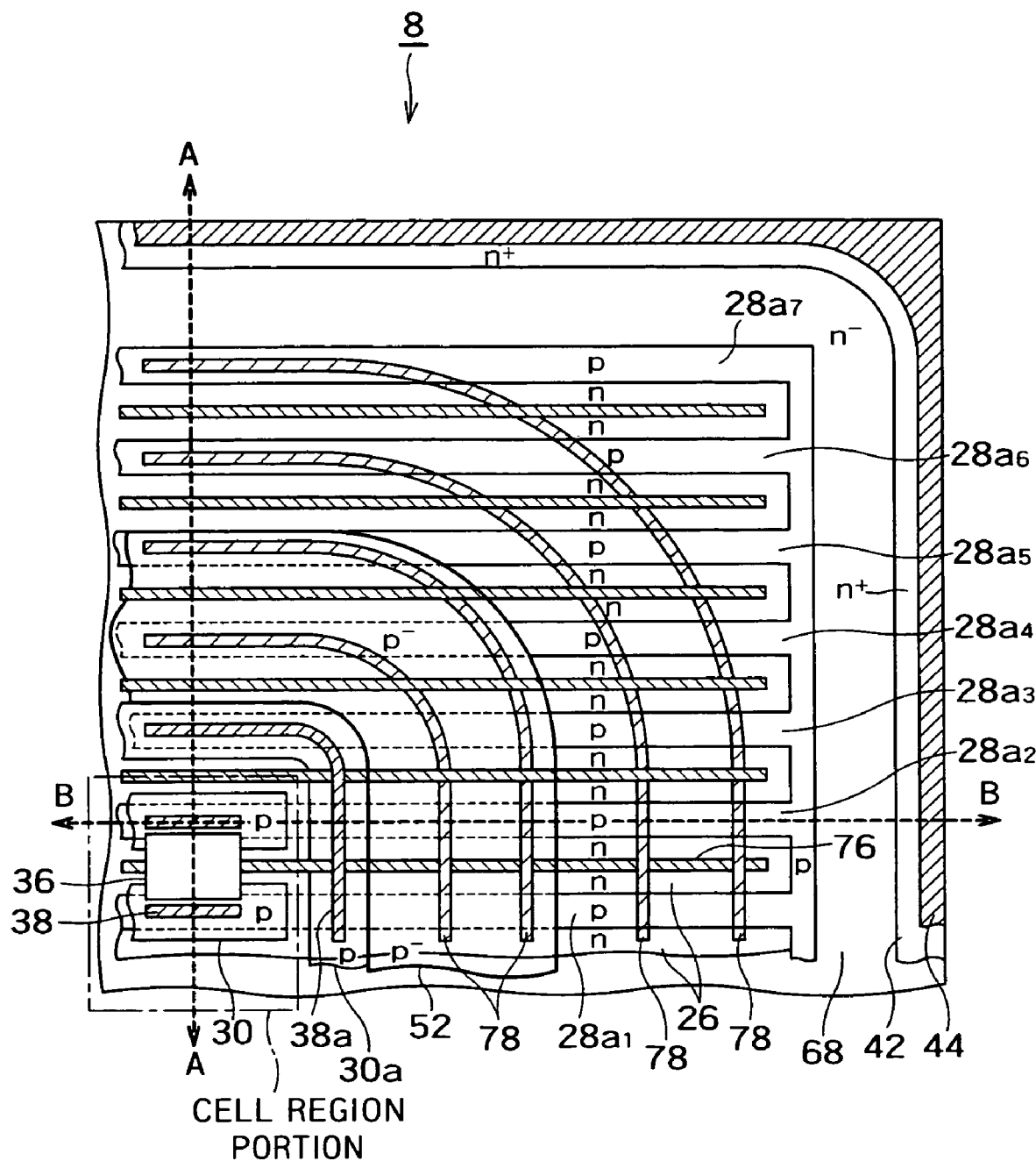
FIG. 19 is a plan view showing a schematic structure of an eighth embodiment of a semiconductor device according to the present invention.
Figure 20:
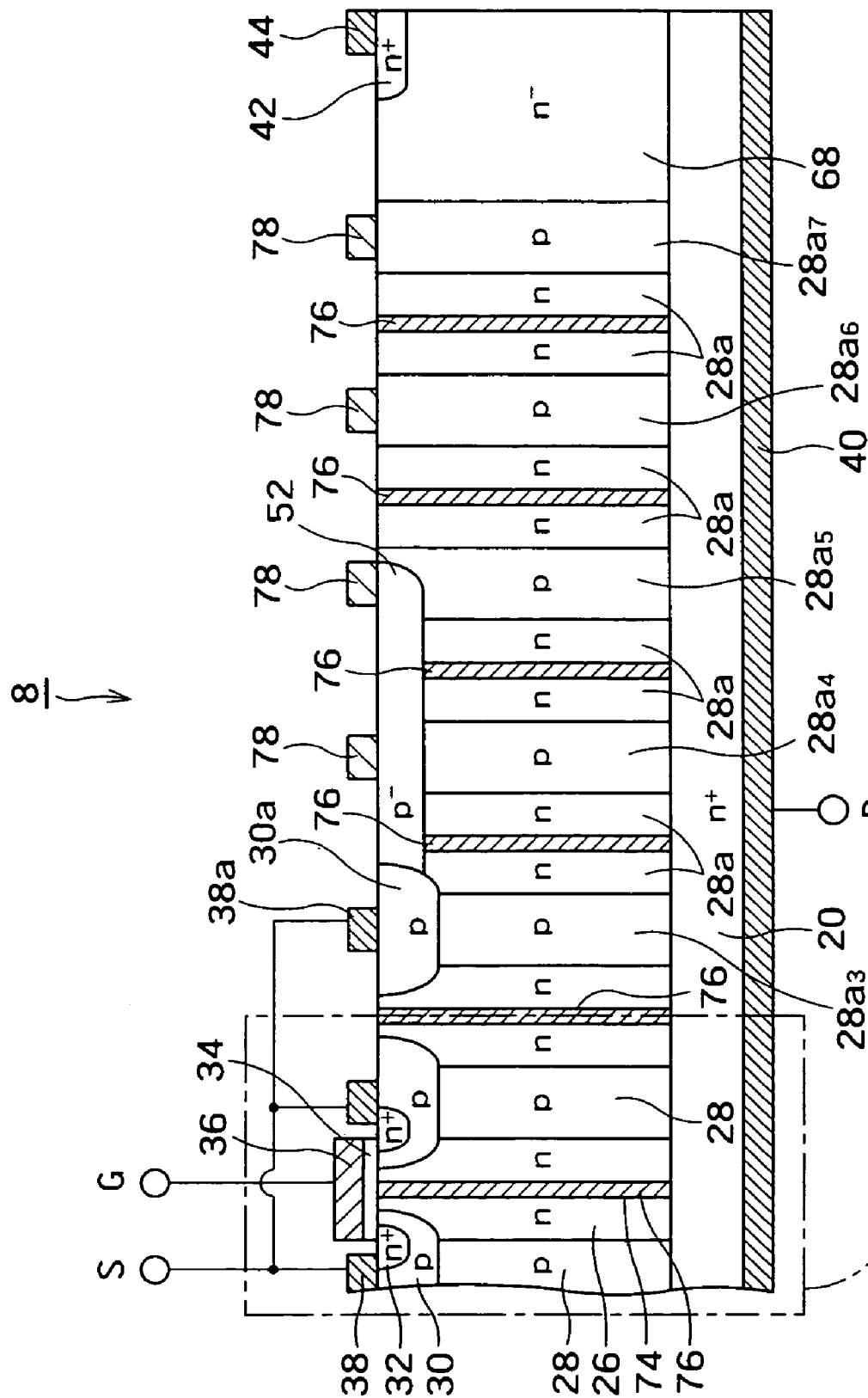
FIG. 20 is a cross-sectional view taken along the cutting line A—A of the semiconductor device shown in FIG. 19.
Figure 21:
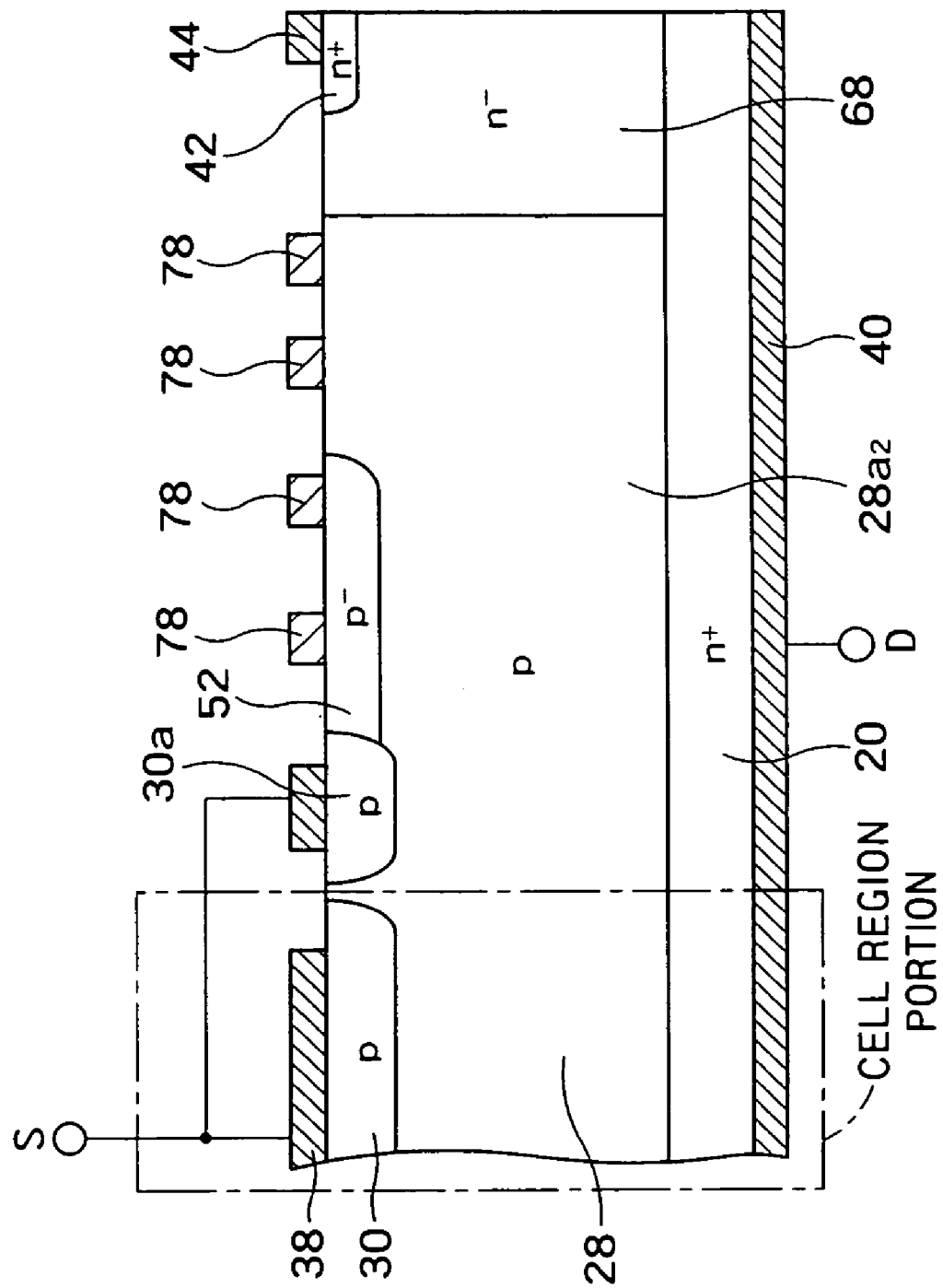
FIG. 21 is a cross-sectional view taken along the cutting line B—B of the semiconductor device shown in FIG. 19.

FIG. 19 is a plan view showing a schematic structure of an eighth embodiment of a semiconductor device according to the present invention. FIG. 20 and FIG. 21 are cross-sectional views of the semiconductor device of the present embodiment taken along the cutting lines A—A and B—B of FIG. 19, respectively.

In the present embodiment, differently from the fifth embodiment shown in FIG. 11, the insulating films 76 and the drift layers 26a, 28a, which are formed so as to extend from the cell region portion toward the junction terminating region portion, are periodically disposed in the vertical direction as well, and are formed up to the vicinity of the periphery of the junction terminating region portion. Further, on the surface portion of the junction terminating region portion, a p− type resurf layer 52 having a predetermined width is provided so as to surround the cell region. Moreover, electrodes 78 for voltage fixing are provided above or on the respective p type drift layers 28a4 through 28a7 periodically disposed in the vertical direction in the junction terminating region portion (see FIG. 20). These electrodes 78 are extendedly formed so as to bend in circular arcs having a center in common with the corner portion of a source electrode 38a with a constant interval between one another, and so as to intersect the p type drift layers 28a1 through 28a3. The electrodes 78 are connected to these p type drift layers 28a1 through 28a3 at the extended portions (see FIG. 21).

In the semiconductor device 8 of the present embodiment, with the structure described above, positive holes in the p type drift layers 28a4 through 28a7 periodically provided in the vertical direction are discharged via the electrodes 78 at the time of turning-off. Therefore, the depletion layers are uniformly extended in the two directions of the horizontal and the vertical directions. Thus, a high breakdown voltage can be maintained.

(9) Ninth Embodiment

Figure 22:
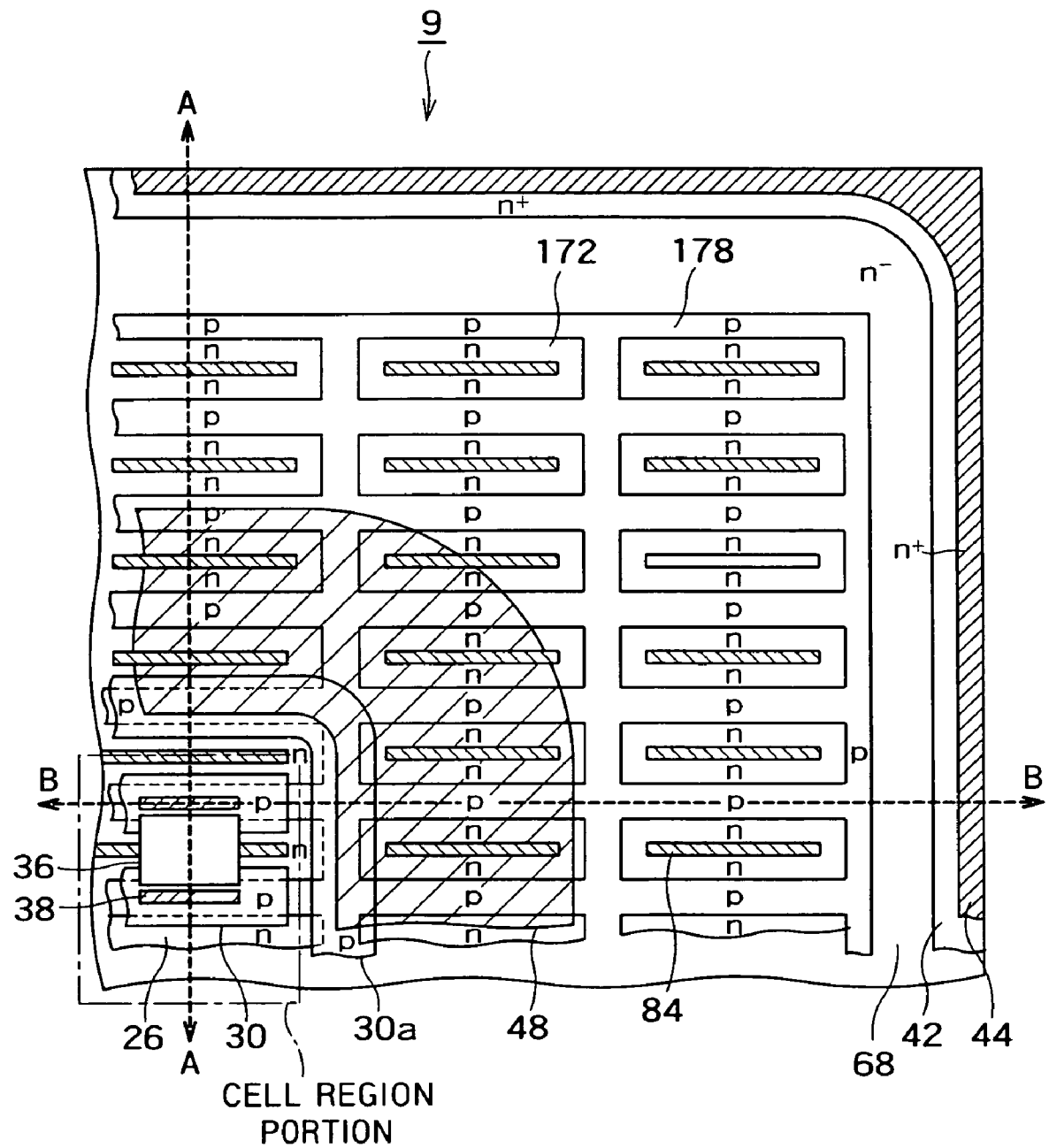
FIG. 22 is a plan view showing a schematic structure of a ninth embodiment of a semiconductor device according to the present invention.
Figure 23:
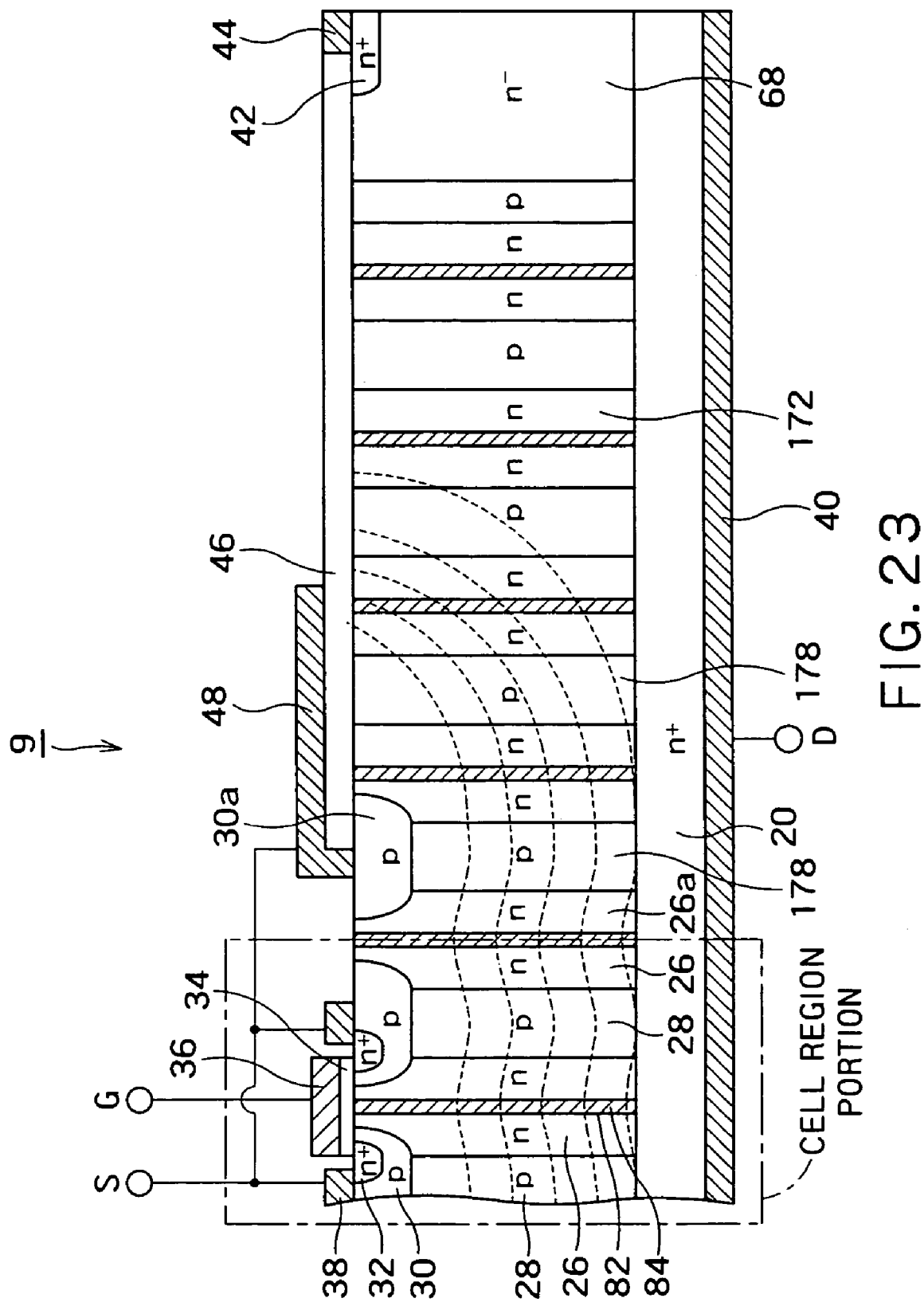
FIG. 23 is a cross-sectional view taken along the cutting line A—A of the semiconductor device shown in FIG. 22.

FIG. 22 is a plan view showing a schematic structure of a ninth embodiment of a semiconductor device according to the present invention. FIG. 23 is a cross-sectional view of the semiconductor device of the present embodiment taken along the cutting line A—A of FIG. 22. Note that the cross-sectional view taken along the cutting line B—B of FIG. 22 is the same as FIG. 3.

Differently from the above-described eighth embodiment, in a semiconductor device 9 of the present embodiment, insulating films 84, which are formed in stripe shapes in the respective horizontal directions in the junction terminating region portion and which are periodically disposed in the vertical direction, and n type drift layers 172 which are formed so as to surround the insulating films 84, are respectively divided in the horizontal direction, and are formed so as to be lattice-shaped in a plan view. Thereby, portions of the p type drift layers 178 in the horizontal directions are connected to one another in the vertical directions. In accordance with the connecting structure of the p type drift layers 178 in the vertical direction, positive holes are discharged at the time of turning-off. Further, in the same way as in the first embodiment described above, the semiconductor device 9 of the present embodiment comprises a fieldplate electrode 48 which is formed so as to connect to the p type base layer 30a formed so as to surround the cell region and which is formed so as to extend onto the insulating film 46 formed on the junction terminating region portion. Thereby the electric field in the junction terminating region portion is attenuated. As a result, a sufficiently high breakdown voltage can be obtained.

(10) Tenth Embodiment

Figure 24:
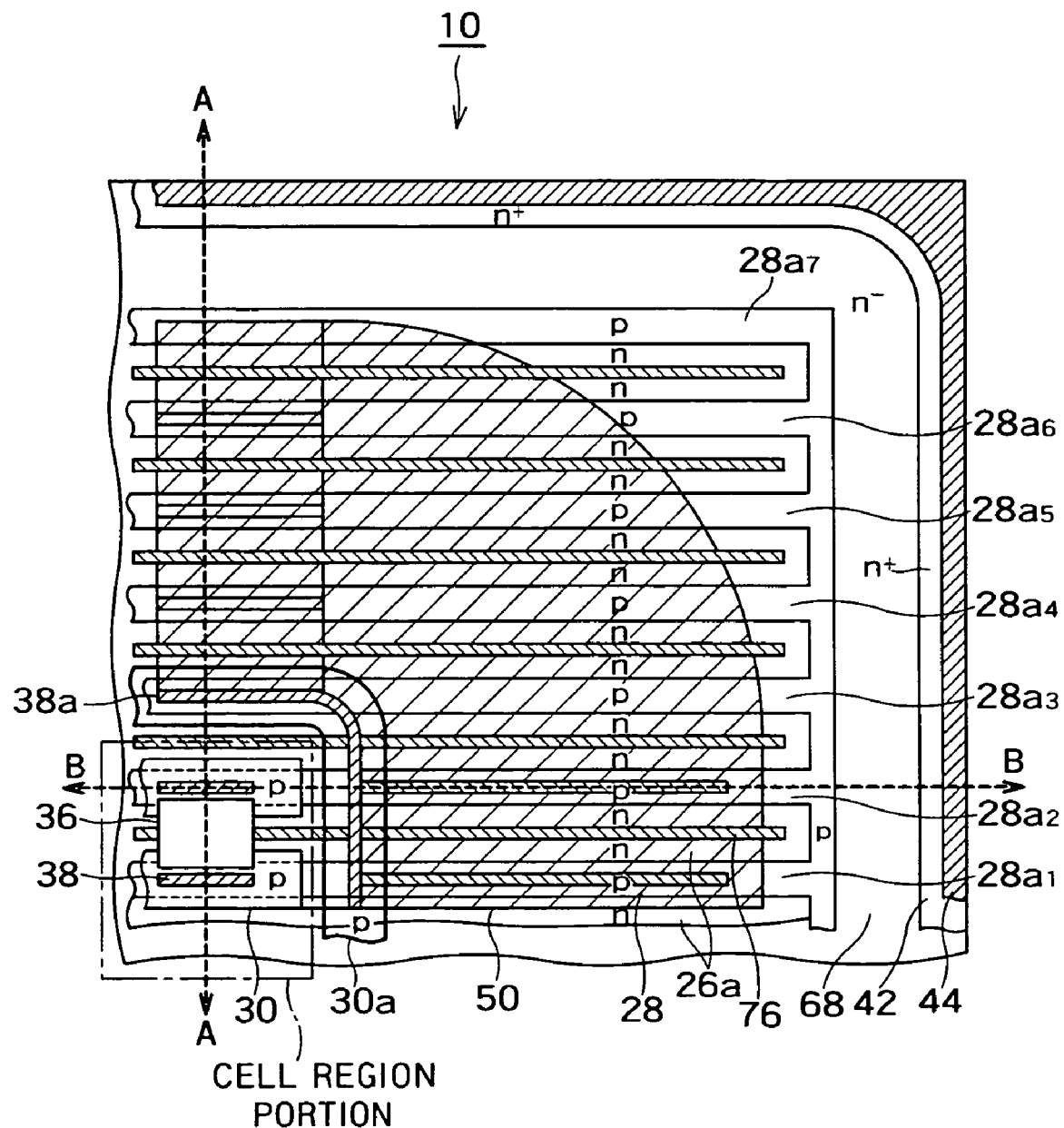
FIG. 24 is a plan view showing a schematic structure of a tenth embodiment of a semiconductor device according to the present invention.
Figure 25:
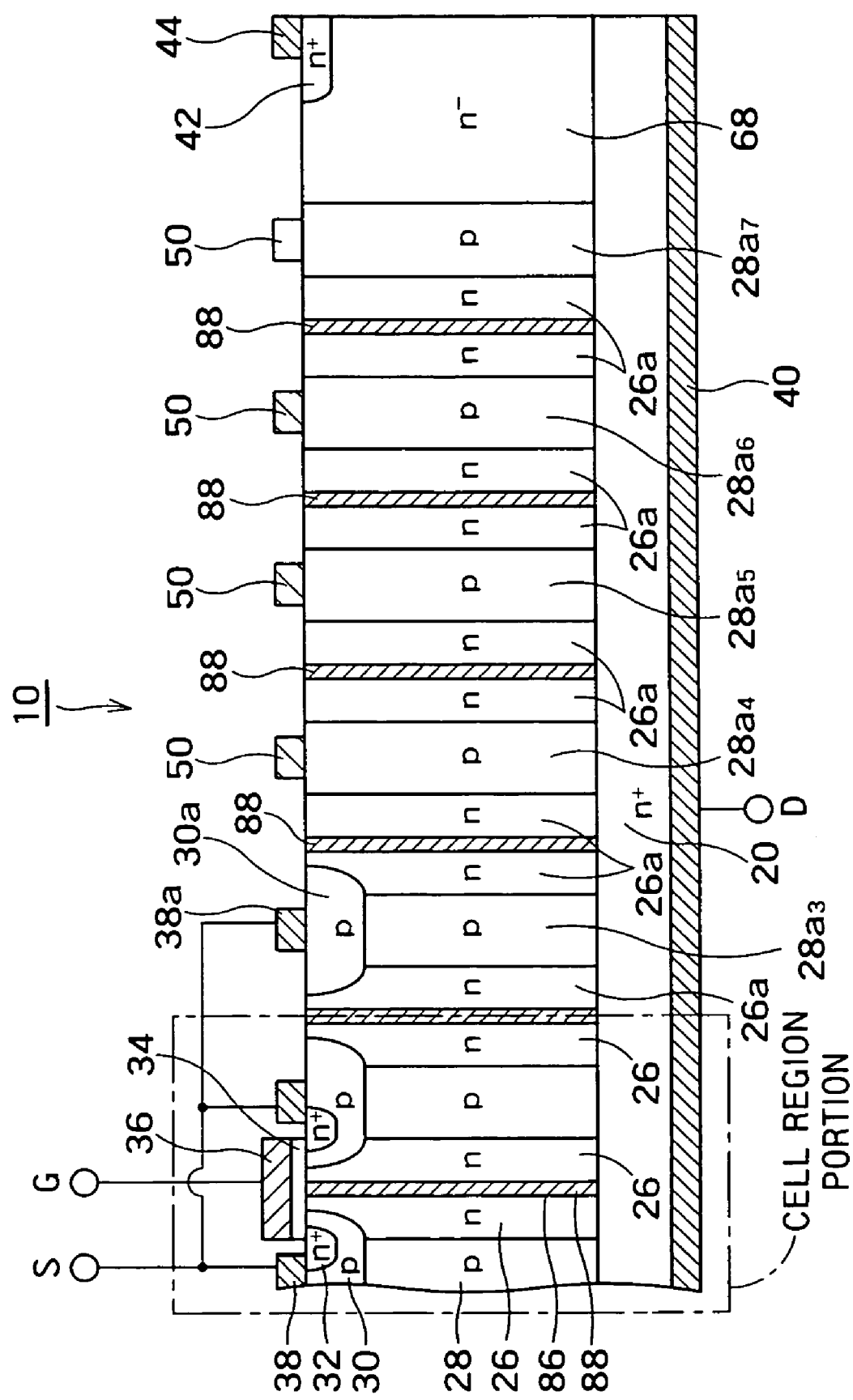
FIG. 25 is a cross-sectional view taken along the cutting line A—A of the semiconductor device shown in FIG. 24.
Figure 26:
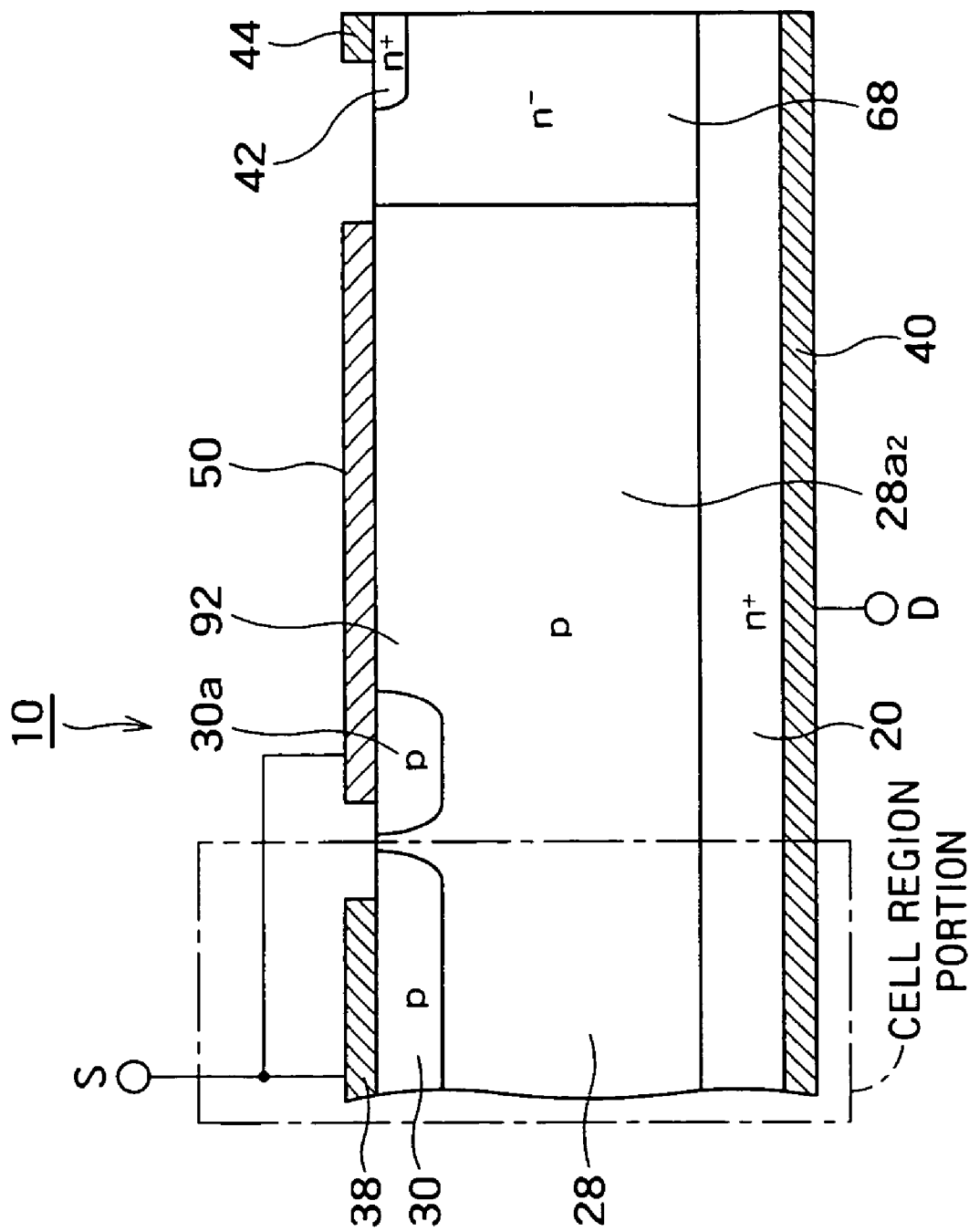
FIG. 26 is a cross-sectional view taken along the cutting line B—B of the semiconductor device shown in FIG. 24.

FIG. 24 is a plan view showing a schematic structure of a tenth embodiment of a semiconductor device according to the present invention. FIG. 25 and FIG. 26 are cross-sectional views of the semiconductor device of the present embodiment taken along the cutting lines A—A and B—B of FIG. 24, respectively.

A semiconductor device 10 of the present embodiment comprises Resistive Field Plates RFPs (which are hereinafter called as RFPS) 50 which are made from semi-insulated polysilicon or the like and are formed in the junction terminating region portion so as to surround the cell region, in place of the p− type resurf layer 52 and the electrode 78 of the semiconductor device 8 shown in FIG. 19. The RFPs 50 are, directly or via the p type base layer 30 in the vicinity of the boundary with the cell region, connected to the source electrode 38a, and are connected to the p type drift layers 28a. In particular, the p type drift layers 28a1 and 28a2, which correspond to the portion at which the p type drift layers 28 in the cell region portion are extended in the horizontal direction, contact the RFPs 50 over substantially the entire length thereof (see FIG. 26). Further, the p type drift layers 28a4 through 28a7, which are periodically formed in the vertical direction in the junction terminating region portion, discretely contact the RFPs 50 over a width corresponding to the width of the cell region portion in the horizontal direction (see FIG. 25).

With such a structure, a sufficient high breakdown voltage can be realized in the semiconductor device 10 because positive holes are discharged from the p type drift layers 28a to the source electrodes 38a via the RFPs 50 at the time of turning-off.

(11) Eleventh Embodiment

Figure 27:
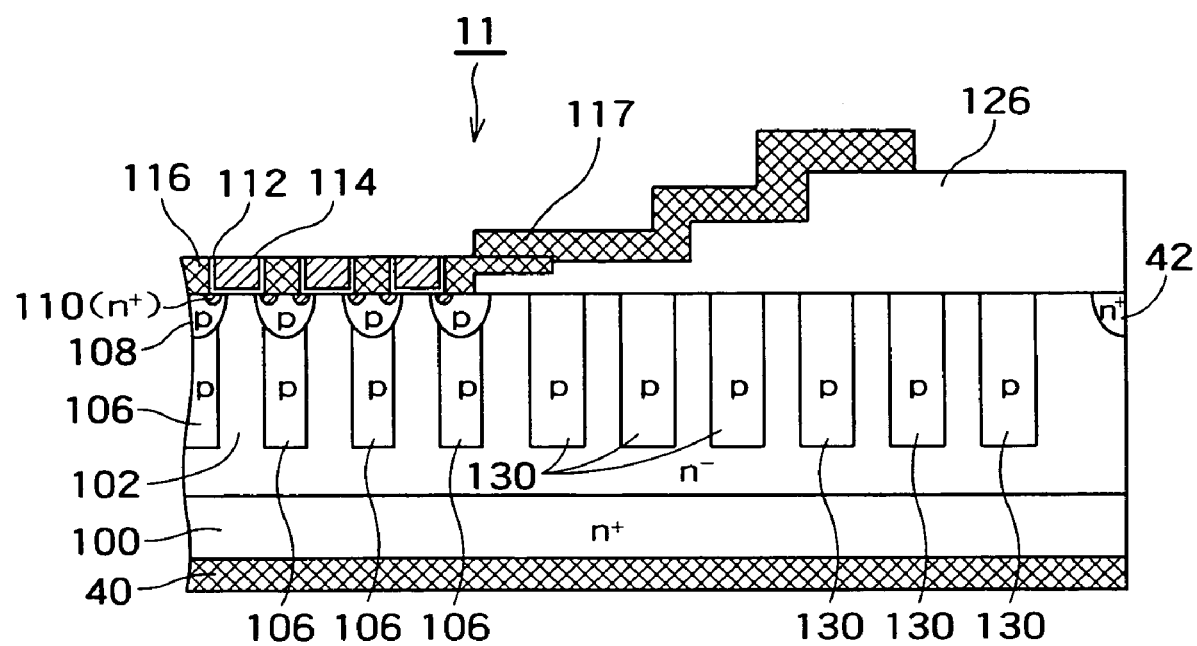
FIG. 27 is a cross-sectional view showing a schematic structure of an eleventh embodiment of a semiconductor device according to the present invention.

FIG. 27 is a cross-sectional view showing a schematic structure of an eleventh embodiment of a semiconductor device according to the present invention.

A vertical type power MOSFET 11 shown in FIG. 27 comprises a semiconductor layer 102 forming a n− base layer, an n+ drain layer 100, a drain electrode 40, a plurality of p type resurf layers 106, 130 forming the super junction structure, p type base layers 108, n+ type source layers 110, gate electrodes 114, and source electrodes 116.

The n+ type drain layer 100 is formed on one surface of the n− type base layer 102, i.e., on the bottom surface in FIG. 27, and the drain electrode 40 is formed on the n+ drain layer 100.

The p type resurf layers 106, 130 are periodically disposed in a predetermined direction not only in the cell region portion but also in the junction terminating region portion, on the other surface portion of the n− type base layer 102, i.e., the top surface portion in FIG. 27. Thereby, a super junction structure is formed, and the p type resurf layer 106 functions as the p type drift layer 106. Further, region portions sandwiched by these p type drift layers 106 of the n− type base layers 102 function as the n− type drift layer 102.

The p type base layer 108 is selectively formed so as to connect to the p type drift layer 106 at the surface portion of the n− type base layer 102 in the cell region portion. The n+ type source layer 110 is selectively diffusion-formed so as to have a striped plane shape in the surface portion of the p type base layer 108. The p type base layer 108 is formed such that, for example, when its impurity concentration is about $3 \times 10^{17}$ cm$^{-3}$, the depth is about 2.0 μm, and the n+ type source layer 110 is formed such that, for example, when its impurity concentration is about $1 \times 10^{20}$ cm$^{-3}$, the depth is about 0.2 μm.

The gate electrode 114 is formed via a gate insulating film 112 e.g. an Si oxide film 112 whose film thickness is 0.1 μm on the surface region from the surface of the n+ type source layer 110 and the surface of the p type base layer 108 up to the surface of the adjacent p type base layer 108 and the surface of the n+ type source layer 110 via the surface of the n− type drift layer 102. The gate electrode 114 is formed so as to be a striped plane shape. The source electrode 116 is formed so as to be a striped plane shape on the surface region of the n+ type source layer 110 in the surface portion of the p type base layer 108, the surface region of the p type base layer 108, and the surface region of the adjacent n+ type source layer 110. The source electrodes 116 are disposed so as to sandwich the gate electrode 114.

On the super junction structure in the junction terminating region portion of the vertical type power MOSFET 11, a conductive film 117 such as metal, polysilicon, or the like is formed via the insulating film 126. Thereby, a field plate structure is constituted in the junction terminating region portion. Note that a field stopper 42 is provided on the surface portion of the periphery of the device, which is formed from an n layer and stops depletion.

With such a structure, the super junction structure portion in the junction terminating region portion is rapidly depleted by the field plate 128 at the time of applying high voltage, and the junction terminating region portion then equivalently becomes a low impurity concentration layer. Therefore, the concentration of an electric field in the junction terminating region portion is suppressed, and a high breakdown voltage is maintained. Note that even if a resurf layer is formed on the surface portion in the junction terminating region portion, the super junction structure portion is rapidly depleted in the same way as the field plate. Therefore, the same effects can be obtained. In FIG. 27, the field plate 117 has a structure having an electric potential which is the same as the source electrode 116. However, it is not limited to this structure, and the field plate 117 may be manufactured so as to have the same electric potential as the gate electrode 114.

Due to the impurity amount of the p type drift layer 130 in the junction terminating region portion being greater than the impurity amount of the p type drift layer 106 in the cell region portion, decrease of breakdown voltage in the junction terminating region portion can be suppressed. The impurity amount of the p type drift layers 106, 130 is a product of the width and the impurity concentration, respectively.

In FIG. 27, although the p type drift layer 130 in the junction terminating region portion is formed so as to have a width which is wider than that of the p type drift layer 106 in the cell region portion, the p type drift layer 130 is formed so as to have an impurity concentration which is the same as that of p type drift layer 106. Thereby, the impurity amount of the p type dopant in the junction terminating region portion increases, and as a result, decrease of breakdown voltage in the junction terminating region portion can be suppressed.

Note that the present invention is not limited to this structure. For example, when the width of the p type drift layer 106 in the cell region portion and the width of the p type drift layer 130 in the junction terminating region portion are made to be the same, and only the impurity concentration in the junction terminating region portion is made to be higher, the same effects can be obtained.

Figure 28:
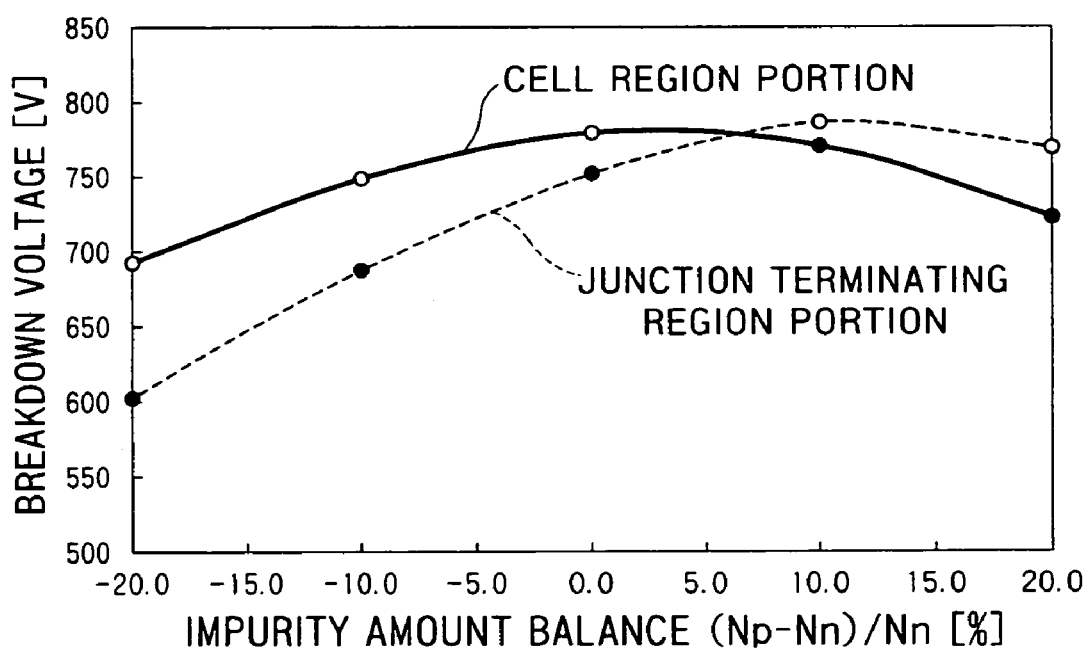
FIG. 28 is a graph showing relationships between a p type dopant amount and a breakdown voltage with respect to a cell region portion and a junction terminating region portion, respectively.

FIG. 28 is a graph showing changes in breakdown voltage when the amount of the p type impurity is changed, with respect to the cell region portion and the junction terminating region portion, respectively. The abscissa of the graph is the ratio of the impurity amount Np of the p type drift layer with respect to the impurity amount Nn of the n− type drift layer. As shown in the graph, it can be understood that, in the cell region portion, the highest breakdown voltage can be obtained when the impurity amount of the n− type drift layer and the impurity amount of the p type drift layer are equal (the unbalance is 0%), and if the impurity amount of the p type drift layer is relatively higher or lower, the breakdown voltage symmetrically decreases around the point of 0% in accordance with the proportion. On the other hand, it can be understood that, in the junction terminating region portion, the highest breakdown voltage can be obtained when the impurity amount of the p type drift layer is relatively 10% higher. Thus, the optimum impurity amounts of the p type drift layer in the cell region portion and in the junction terminating region portion are different from one another. If the p type drift layer is formed also in the junction terminating region portion so as to have a concentration which is the same as the optimum concentration for the p type drift layer in the cell region portion, the breakdown voltage in the junction terminating region portion decreases. As is clear from FIG. 28, the optimum impurity amount in the junction terminating region portion is higher than that in the cell region portion.

The impurity amount of the p type drift layer in the cell region portion is optimally set to 80 to 120% of that of the n− type drift layer, including the process margin. The impurity amount of the p type drift layer in the junction terminating region portion is optimally set to 90 to 130% of that of the n− type drift layer, including the process margin. Therefore, the impurity amount of the p type drift layer at the terminating portion is preferably set to 75 to 163% of the impurity amount of the p type drift layer in the cell region portion. The impurity amount of the p type drift layer, at which the highest breakdown voltage can be obtained, is higher at the terminating portion. Therefore, the impurity amount of the p type drift layer at the terminating portion is more preferably set to 100 to 163% of the impurity amount in the cell region portion.

The method for forming the super junction structure may be any of, for example, a method in which an ion injection and buried crystal growth are repeated, a method in which a trench groove is formed and buried epitaxy is carried out, and a method in which an ion injection is carried out from an oblique direction after a trench groove is formed.

It is possible to increase the p type drift layer concentration in the junction terminating region portion in accordance with each method of forming the super junction structure.

In the method in which the super junction structure is formed by repeating ion injection and buried crystal growth, ion injection may be carried out individually in the cell region portion and in the junction terminating region portion, or an ion injection may be carried out at the same time in the cell region portion and the junction terminating region portion, with the mask opening width for ion injection being changed.

In the method in which, after a trench groove is formed, the trench groove interior is buried with crystal growth, or in the method in which the super junction structure is formed by carrying out ion injection or gaseous phase diffusion from an oblique direction, the trench groove width or the mesa width may be varied in the cell region portion and the junction terminating region portion.

Further, if the impurity amount of the p type drift layer is made to be the same in the cell region portion and in the junction terminating region portion, and the impurity amount of the n– type drift layer in the junction terminating region portion is made to be lower than that in the cell region portion, the same effects can be obtained.

(12) Twelfth Embodiment

Figure 29:
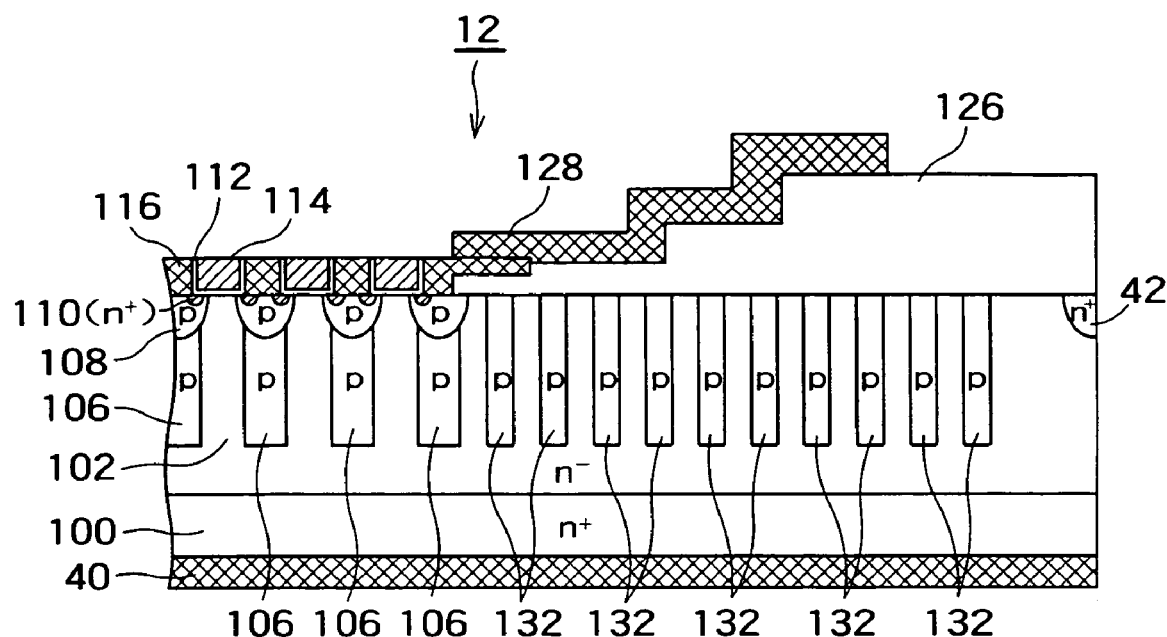
FIG. 29 is a cross-sectional view showing a schematic structure of a twelfth embodiment of a semiconductor device according to the present invention.

FIG. 29 is a cross-sectional view showing a schematic structure of a twelfth embodiment of a semiconductor device according to the present invention.

The semiconductor device 12 of the present embodiment is characterized in that the super junction structure is structured by p type drift layers whose cell pitches are different from one another in the cell region portion and the junction terminating region portion. Specifically, a cell pitch of a p type drift layer 132 in the junction terminating region portion is made to be narrower than that of the p type drift layer 106 in the cell region portion. Due to the cell width in the junction terminating region portion being made narrow, depletion in the junction terminating region portion then rapidly proceeds at the time of turning-off. As a result, a lowering of the breakdown voltage in the junction terminating region portion is suppressed.

Figure 30:
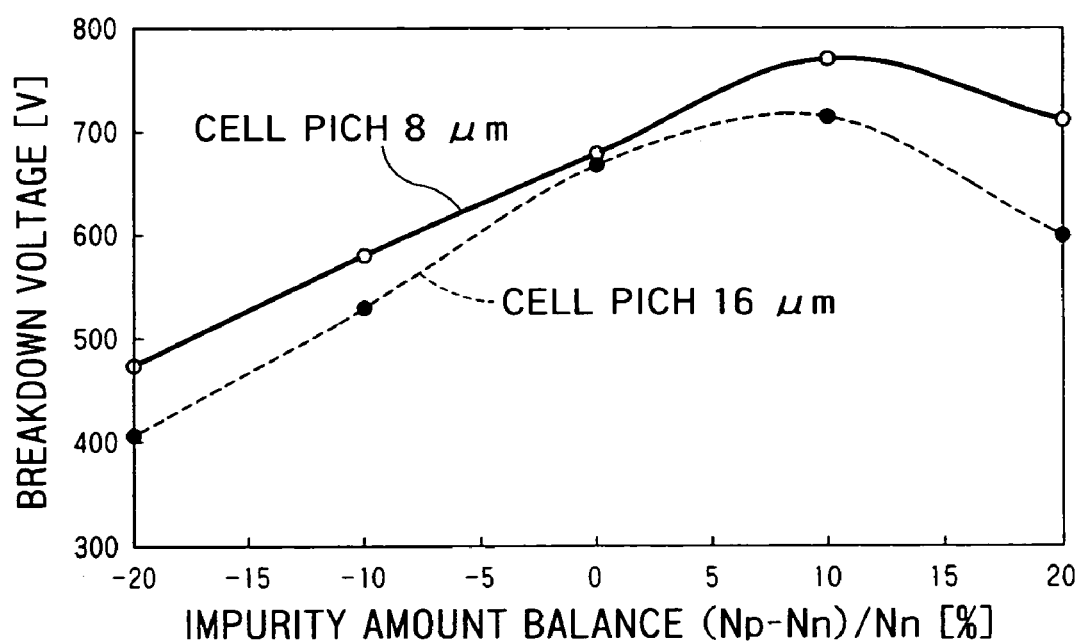
FIG. 30 is a graph showing changes in the breakdown voltage with respect to the impurity balance of a p type resurf layer and an n– type drift layer.

FIG. 30 is a graph showing changes in breakdown voltage with respect to the impurity balance between the p type drift layer and the n– type drift layer. The impurity concentration of the n– type drift layer is set to $2.5 \times 10^{15}$ cm$^{-3}$. Comparing a case in which the cell pitch is 16 µm and a case in which the cell pitch is 8 µm, the decrease in the breakdown voltage is smaller with respect to the balance of the impurity in the case of 8 µm in which the cell pitch is narrower than 16 µm. Thereby, it can be understood that the margin with respect to the impurity concentration balance can be made larger by making the cell pitch narrower.

Moreover, focusing on the impurity amount balance between the n– type drift layer and the p type drift layer, even if the cell width is changed, the optimum impurity amount of the p type drift layer at which the highest breakdown voltage is obtained is greater than the impurity amount of the n– type drift layer. On the basis of this, it can be understood that, even in a case in which the cell width in the junction terminating region portion is made narrow, it is preferable that the impurity amount of the p type drift layer in the junction terminating region portion is greater than that in the cell region portion.

(13) Thirteenth Embodiment

Figure 31:
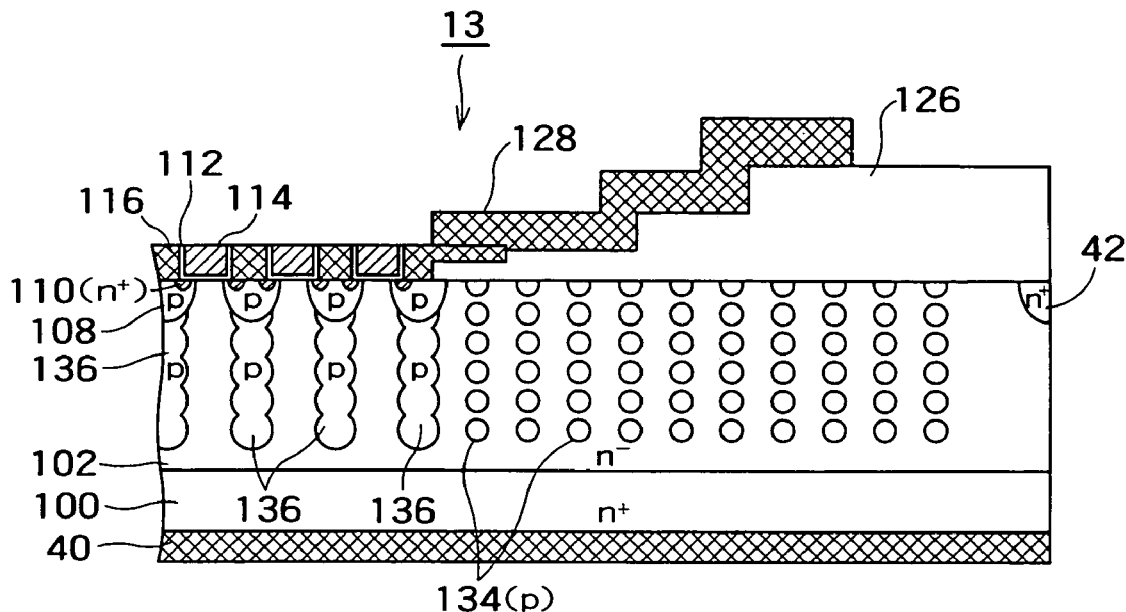
FIG. 31 is a cross-sectional view showing a schematic structure of a thirteenth embodiment of a semiconductor device according to the present invention.

FIG. 31 is a cross-sectional view showing a schematic structure of a thirteenth embodiment of a semiconductor device according to the present invention.

The semiconductor device 13 of the present embodiment is characterized in the shape of a p type drift layer 134 in the junction terminating region portion. Specifically, the p type drift layer 134 is buried so as not to have a pillar-shaped cross-sectional shape as in the respective embodiments described above but so as to have a circular cross sectional shape. If the p type drift layer 134 structuring the super junction structure have such a circular cross sectional shape in the cell region portion, once it is depleted by turning-off in the p type drift layer, the depletion is maintained. However, in the present embodiment, the p type drift layers 134 in the junction terminating region portion does not affect the on operation of the semiconductor device 13 because the p type drift layers 134 in circular cross sectional shapes are formed only in the junction terminating region portion.

When the method in which ion injection and buried crystal growth are repeated is used in forming the super junction structure, if the cell pitch of the super junction structure in the junction terminating region portion is made narrow, the amount of dopant injecting ions is reduced in the terminating region. The p type drift layer 134 of the present embodiment has a structure which can be obtained when diffusion after burying and growing is used in order to solve such a problem. Specifically, in accordance with diffusion after burying and growing, the concentration of the buried p layer is higher in the cell region portion and is lower in the junction terminating region portion. As a result, the upper and lower p layers are connected in the cell region portion, and the p type drift layer is formed in a pillar-shaped cross sectional shape. But in the junction terminating region portion, the respective buried layers are not connected, and have circular cross sectional shapes. However, if the cell pitch is made too narrow in the junction terminating region portion, the p type drift layers which are adjacent to one another are connected to one another. Therefore, the cell pitch in the junction terminating region portion is preferably set to a value greater than or equal to half of the cell pitch in the cell region portion.

(14) Fourteenth Embodiment

Figure 32:
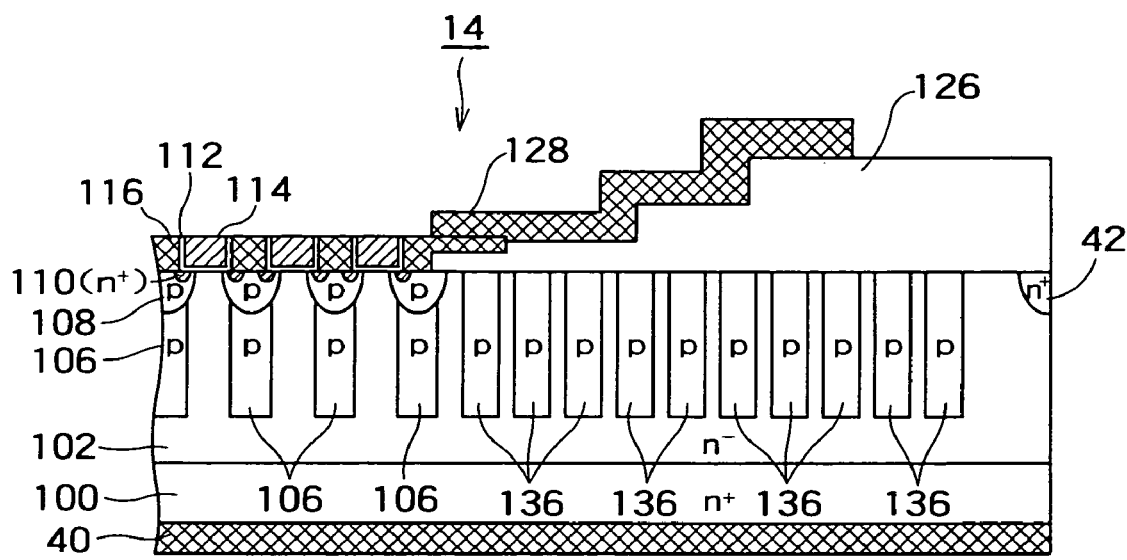
FIG. 32 is a cross-sectional view showing a schematic structure of a fourteenth embodiment of a semiconductor device according to the present invention.

FIG. 32 is a cross-sectional view showing a schematic structure of a fourteenth embodiment of a semiconductor device according to the present invention. A semiconductor device 14 of the present embodiment is formed such that the cell width of the super junction structure in the junction terminating region portion is narrower than the cell width in the cell region portion, and is formed such that the mesa width of the p type drift layer 136 in the junction terminating region portion is relatively wider. Thereby, the impurity concentration of the p type drift layer 136 in the junction terminating region portion can be made higher than that in the cell region portion. With such a structure, lowering of the breakdown voltage in the junction terminating region portion can be suppressed in the semiconductor device 14 of the present embodiment.

(15) Fifteenth Embodiment

Figure 33:
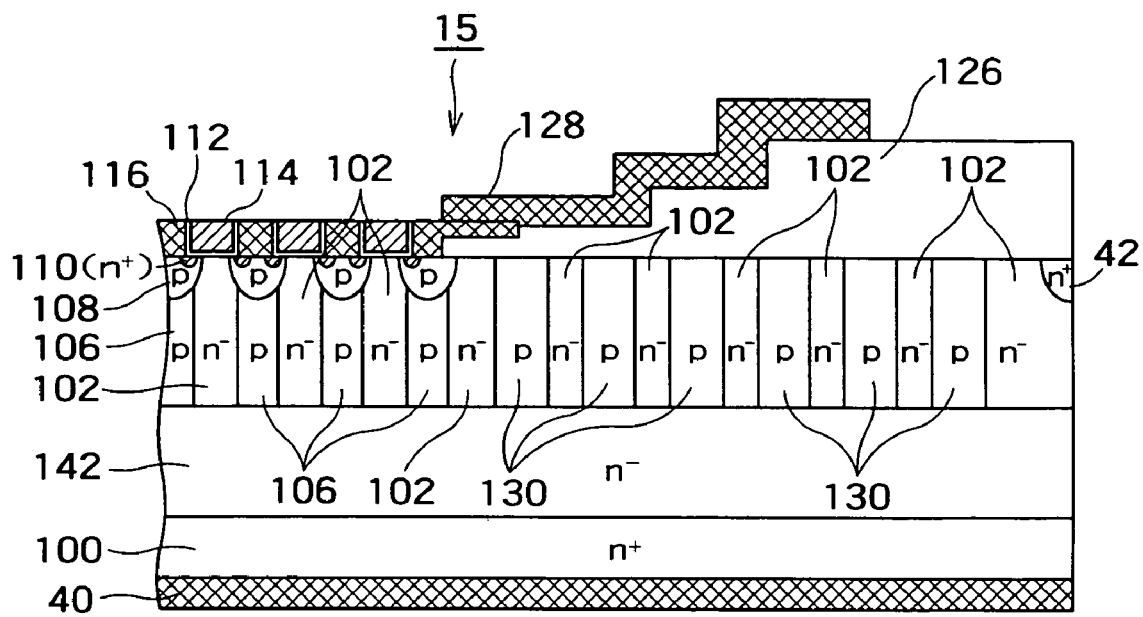
FIG. 33 is a cross-sectional view showing a schematic structure of a fifteenth embodiment of a semiconductor device according to the present invention.

FIG. 33 is a cross-sectional view showing a schematic structure of a fifteenth embodiment of a semiconductor device according to the present invention. As is clear in comparison with the semiconductor device 11 shown in FIG. 27, a semiconductor device 15 of the present embodiment is characterized in that it further comprises an n– type drift layer 142 provided between the super junction structure and the n+ drain layer 100, and the n– type drift layer 142 and the super junction structure also constitute n type drift layers. The n– type drift layer 142 is formed so as to have an impurity concentration which is lower than that of the n– type drift layer 102 in the super junction structure. Even when such an n– type drift layer 142 is provided, because the breakdown voltage is determined by the depletion of the upper super junction structure, a junction terminating regional structure can be designed as in the semiconductor devices 1 through 10 in the super junction structure described above. In the semiconductor device 15 of the present embodiment, due to the width of the p type drift layer 130 in the junction terminating region portion being made wider than that of the p type drift layer 106 in the cell region portion, the p type impurity amount of the super junction structure in the junction terminating region portion is made greater than that in the cell region portion in the same way as in the eleventh embodiment shown in FIG. 27. Thereby, a decrease in the breakdown voltage in the junction terminating region portion can be suppressed.

(16) Sixteenth Embodiment

Figure 34:
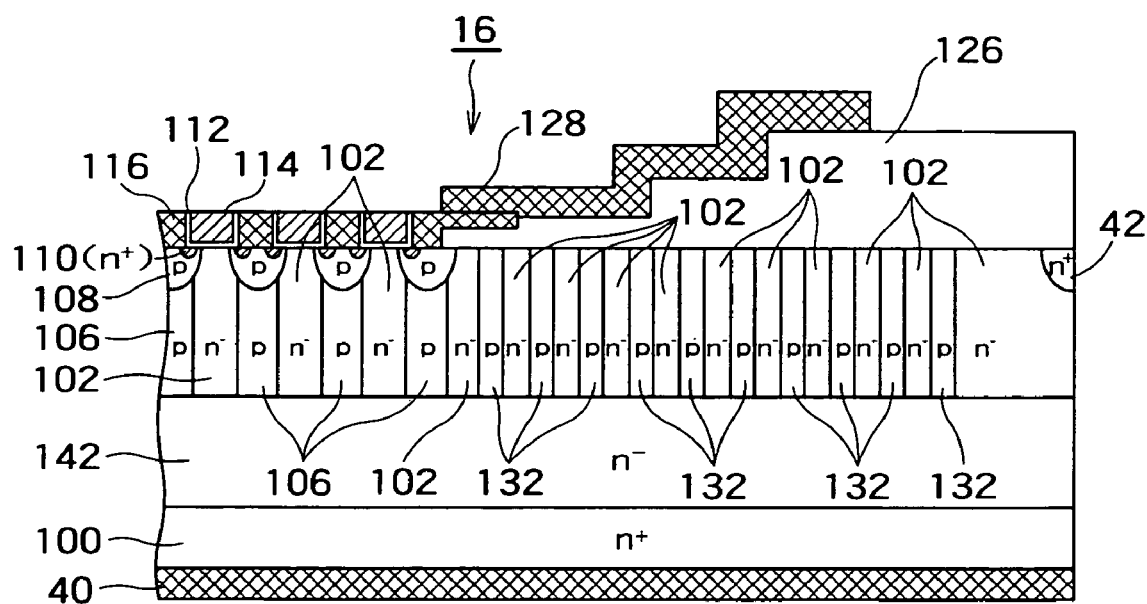
FIG. 34 is a cross-sectional view showing a schematic structure of a sixteenth embodiment of a semiconductor device according to the present invention.

FIG. 34 is a cross-sectional view showing a schematic structure of a sixteenth embodiment of a semiconductor device according to the present invention. In the same way as in the fifteenth embodiment described above, in a semiconductor device 16 shown in FIG. 34, n type drift layers are constituted by the n– type drift layer 142 and the super junction structure. The n– type drift layer 142 has an impurity concentration which is lower than that of the n– type drift layer 102 in the super junction structure. In the present embodiment, as the structure of the junction terminating region portion, due to the cell pitch of the super junction structure in the junction terminating region portion being made narrower than the cell pitch in the cell region portion, the margin with respect to the concentration balance between the p type drift layer 132 and the n– type drift layer 102 can be made wider. Moreover, if the impurity amount of the p type drift layer 132 in the junction terminating region portion is made greater than that in the cell region portion, a decrease in the breakdown voltage in the junction terminating region portion can be further suppressed.

(B) Embodiment of the Method of Manufacturing Semiconductor Device

FIG. 35A through 35F are schematic cross-sectional views showing one embodiment of a method of manufacturing the semiconductor device according to the present invention. The present embodiment provides a method in which the super junction structures in the respective embodiments of the semiconductor device of the present invention described above are formed by carrying out crystal growth a small number of times.

In a conventional process in which ion injection and buried crystal growth are repeated, because the p type resurf layer (p type drift layer) is formed by diffusion, the crystal growth film thickness of one time cannot be made thick. Therefore, it is necessary to repeat ion injection and buried crystal growth five to seven times. Further, as another conventional process, there is a method in which the trench groove is buried with crystal growth after the trench groove is formed. In this case, the number of buried growths can be one time. However, such buried crystal growth has been difficult because the value of the aspect ratio of the trench groove anticipated in the super junction structure is high, specifically greater than or equal to 5.

Figure 35A:
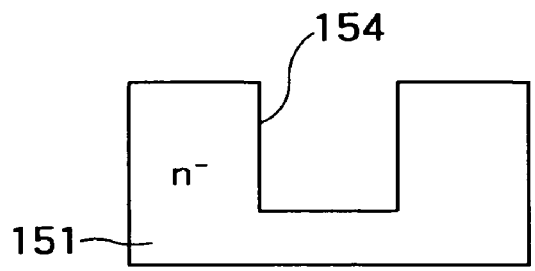
FIGS. 35A through 35F are schematic cross-sectional views showing one embodiment of a method of manufacturing the semiconductor device according to the present invention.
Figure 35B:
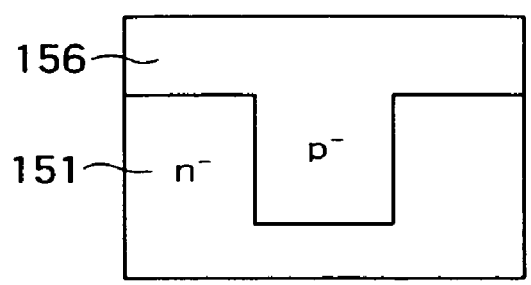
Figure 35C:
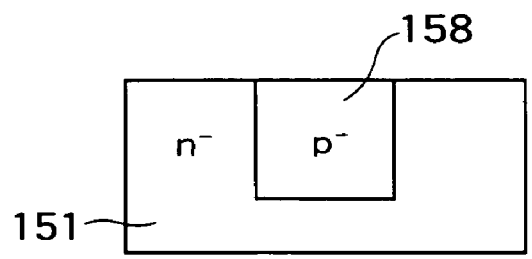
Figure 35D:
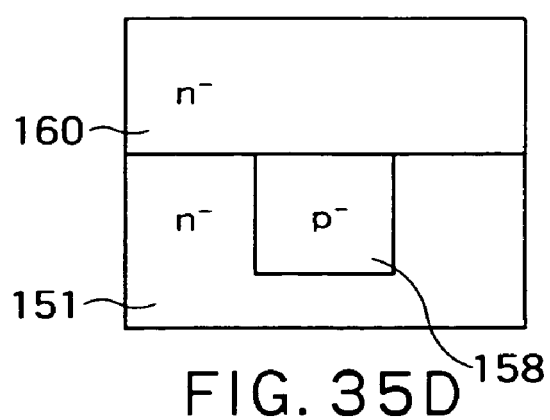
Figure 35E:
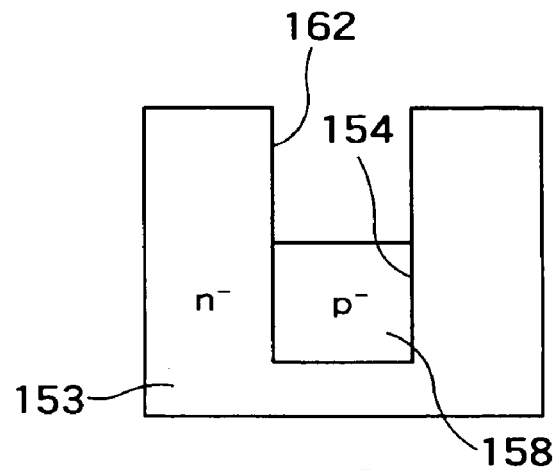
Figure 35F:
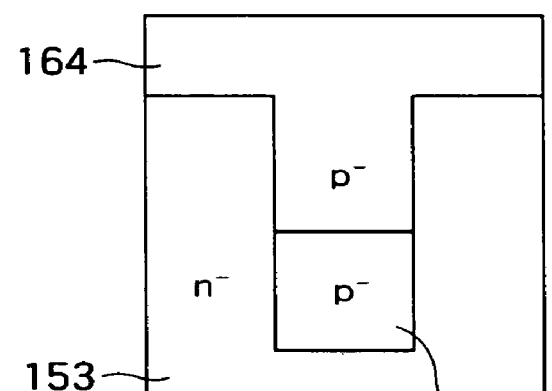

As shown in FIG. 35A through 35F, the manufacturing method of the present embodiment is characterized in that a trench buried crystal growth of low aspect ratio is repeated a plurality of times. Specifically, first, a trench groove 154 whose aspect ratio is half of the aspect ratio which will be finally required is formed in the n– type semiconductor layer 151 (FIG. 35A), and a p– type semiconductor layer 156 is epitaxially grown so as to bury the trench groove 154 (FIG. 35B). Next, the p– type semiconductor layer 156 is withdrawn back until the surface of the n– type semiconductor layer 151 is exposed, and a semiconductor layer 158 buried in the trench groove is obtained (FIG. 35C). Thereafter, the n– type semiconductor layer is further epitaxially grown so as to cover the n– type semiconductor layer 151 and the p– type semiconductor layer 158, and an n– type semiconductor layer 160 having a film thickness which is the same as the film thickness of the p– type semiconductor layer 158 is formed (FIG. 35D). Next, a trench groove 162 matching the trench groove 154 is formed in the n– type semiconductor layer 160 (FIG. 35E). Finally, the n– type semiconductor layer 164 is epitaxially grown so as to cover the n– type semiconductor layer 153 and the p– type semiconductor layer 158 (FIG. 35F). In accordance with the semiconductor device manufacturing method of the present embodiment, because buried growth can be carried out with relative easy, the super junction structure can thus be formed by a number of crystal growths which is less than that of the conventional process in which ion injection and buried crystal growth are repeated.

Note that, in the present embodiment, the super junction structure can be formed by carrying out trench buried crystal growths twice. However, the present invention is not limited thereto. For example, the trench buried crystal growth may be repeated three times or more with the aspect ratio per one time being set to one of third of a required aspect ratio. Further, if the super junction structures of the first time and the second time are formed in a striped shape and are formed so as to intersect one another, alignment can be exactly carried out.

Embodiments of the present invention have been described above. However, the present invention is not limited to these embodiments, and can be modified and achieved within the scope and the sprits thereof. For example, in the respective embodiments described above, the super junction structure, the p type base layer, the n+ source layer, and the gate electrode are formed in striped shapes. However, they may be formed so as to be in lattice shapes or staggered shapes. Furthermore, vertical power MOSFETs using silicon (Si) serving as semiconductor materials have been described. However, as other materials, for example, diamond can be used in addition to compound semiconductors such as silicon carbide (SiC), gallium nitride (GaN), aluminum nitride (AlN), or the like.

What is claimed is:

1. A method of manufacturing a semiconductor device having a super junction structure with a first conductivity type semiconductor layer on which a trench groove whose aspect ratio is R is provided and a second conductivity type semiconductor layer which is buried in the trench groove, the method of manufacturing the semiconductor device comprising:

forming a trench groove having an aspect ratio of R/N, N being a natural number greater than 1, in a first conductivity type semiconductor layer;

epitaxially growing a second conductivity type semiconductor layer so as to bury the trench groove;

removing the second conductivity type semiconductor layer until a surface of the first conductivity type semiconductor layer is exposed;

epitaxially growing the first conductivity type semiconductor layer on the first conductivity type semiconductor layer and the second conductivity type semiconductor layer such that the thickness of the first conductivity type semiconductor layer increases by a length which is substantially the same as a depth of the trench groove formed by said first process;

selectively removing the first conductivity type semiconductor layer such that the second conductivity type semiconductor layer which is buried in the trench groove formed by said first process is exposed; and repeating said epitaxially growing the second conductivity type semiconductor layer through selectively removing the first conductivity type semiconductor layer N−1 times.

\* \* \* \* \*